(12) United States Patent
Kim et al.

(10) Patent No.: US 8,279,671 B2
(45) Date of Patent: Oct. 2, 2012

(54) FLASH MEMORY DEVICES, METHODS FOR PROGRAMMING THE SAME, AND MEMORY SYSTEMS INCLUDING THE SAME

(75) Inventors: Jae Ho Kim, Gyeonggi-do (KR);
Jungdal Choi, Gyeonggi-do (KR);
Hyunjae Kim, Gyeonggi-do (KR);
Hyun-Sil Oh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 277 days.

(21) Appl. No.: 12/711,383

(22) Filed: Feb. 24, 2010

(65) Prior Publication Data

US 2010/0214846 A1 Aug. 26, 2010

(30) Foreign Application Priority Data

Feb. 26, 2009 (KR) .................. 10-2009-0016404

(51) Int. Cl.
*G11C 16/04* (2006.01)

(52) U.S. Cl. ............................. 365/185.05; 365/185.18

(58) Field of Classification Search ............. 365/185.05, 365/185.18, 185.23, 185.09
See application file for complete search history.

(56) References Cited

U.S. PATENT DOCUMENTS

| | | | |
|---|---|---|---|
| 5,621,684 A | 4/1997 | Jung | |
| 2010/0202211 A1* | 8/2010 | Park et al. | 365/185.19 |
| 2011/0044108 A1* | 2/2011 | Byeon et al. | 365/185.05 |

FOREIGN PATENT DOCUMENTS

| | | |
|---|---|---|
| JP | 2000-243094 | 9/2000 |
| KR | 100761470 B1 | 9/2007 |
| KR | 1020080010032 A | 1/2008 |

* cited by examiner

*Primary Examiner* — Vu Le
(74) *Attorney, Agent, or Firm* — Myers Bigel Sibley & Sajovec

(57) ABSTRACT

A programming method of a nonvolatile memory device is provided including: applying a local voltage to a first unselected word line; applying a local voltage to a second unselected word line, after the local voltage is applied to the first unselected word line; and applying a pass voltage to the first unselected word line, after the local voltage is applied to the second unselected word line. Related devices and systems are also provided herein.

20 Claims, 24 Drawing Sheets

FLASH MEMORY DEVICES, METHODS FOR PROGRAMMING THE SAME, AND MEMORY SYSTEMS INCLUDING THE SAME

CLAIM OF PRIORITY

This application claims priority to Korean Patent Application No. 10-2009-0016404, filed Feb. 26, 2009, the content of which is hereby incorporated herein by reference as if set forth in its entirety.

FIELD

This invention generally to memory devices and, more particularly, to phase-flash memory devices and related methods and systems.

BACKGROUND

A semiconductor memory device is a storage device that stores data and reads the data, if necessary. Semiconductor memory devices are largely classified into two groups, volatile memory devices and nonvolatile memory devices.

Volatile memory devices are memory devices that lose stored data when power source is interrupted. Volatile memory devices include, for example, Static Random Access Memory (SRAM), Dynamic Random Access Memory (DRAM), and Synchronous DRAM (SDRAM). Nonvolatile memory devices are memory devices that hold stored data even when power source is interrupted. Nonvolatile memory devices include, for example, Read Only Memory (ROM), Programmable ROM (PROM), Erasable PROM (EPROM), Electrically EPROM (EEPROM), flash memory device, Parameter RAM (PRAM), Magnetoresistive RAM (MRAM), Resistive RAM (RRAM), and Ferroelectric RAM (FRAM). Flash memory devices are largely divided into two groups, NOR type flash memory and NAND type flash memory.

SUMMARY

Some embodiments provide programming methods of a nonvolatile memory device including: applying a local voltage to a first unselected word line; applying a local voltage to a second unselected word line, after the local voltage is applied to the first unselected word line; and applying a pass voltage to the first unselected word line, after the local voltage is applied to the second unselected word line.

In further embodiments, the first unselected word line may be located between a selected word line and a selected line, and the second unselected word line may be located between the first unselected word line and the selected line.

In still further embodiments, the programming method may further include: applying a pass voltage to a selected word line, when the local voltage is applied to the first unselected word line. The local voltage may be applied to the second unselected word line, after the voltage of the selected word line reaches a target level of the pass voltage.

In some embodiments, the pass voltage may be applied to the first unselected word line, after the voltage of the second unselected word line reaches a target level of the local voltage. Further, the programming method may further include: applying a program voltage to a selected word line, after a voltage of the first unselected word line reaches a target level of the pass voltage.

In further embodiments, the programming method may further include: applying a program voltage to a selected word line, before the local voltage is applied to the second unselected word line. In these embodiments, the local voltage may be applied to the second unselected word line, before a voltage of the selected word line reaches a target level of the program voltage. A voltage of the first unselected word line may be controlled so as to reach the target level of the pass voltage, before the voltage of the selected word line reaches a target level of the program voltage.

In still further embodiments, the programming method may further include: applying a local voltage to a third unselected word line, after the pass voltage is applied to the first unselected word line; and applying a pass voltage to the second unselected word line, after the local voltage is applied to the third unselected word line. Further, the first to third unselected word lines may be sequentially disposed in a direction from a selected word line toward a selected line.

In some embodiments, the programming method may further include: applying a local voltage to a third unselected word line located between the first and second unselected word lines, when the local voltage is applied to the first unselected word line. In these embodiments, the first and second unselected word lines may be located between a selected line and a selected word line.

In further embodiments, the programming method may further include: applying a local voltage to a third unselected word line located between a second selected line and a selected word line, when the local voltage is applied to the first unselected word line. In these embodiments, the first and second unselected word lines may be located between a first selected line and the selected word line.

Still further embodiments discussed herein provide nonvolatile memory devices including: a memory cell array including a selected transistor and first and second memory cells between selected memory cells; and a program controller for controlling a program operation of the selected memory cell. In these embodiments, the program controller is configured such that a local voltage is applied to the second memory cell after being applied to the first memory cell, during the program operation of the selected memory cell.

In some embodiments, the program controller may be configured to apply a pass voltage to the selected memory cell when the local voltage is applied to the first memory cell.

In further embodiments, the program controller may be configured to apply a pass voltage to the first memory cell after the local voltage is applied to the second memory cell.

In still further embodiments, the program controller may be configured to apply a program voltage to the selected memory cell after the pass voltage is applied to the first memory cell. Moreover, the program controller may be configured to apply a program voltage to the selected memory cell after the pass voltage is applied to the first memory cell.

In some embodiments, the program controller may be configured to apply a program voltage to the selected memory cell before the local voltage is applied to the second memory cell.

Further embodiments discussed herein provide memory systems including: a nonvolatile memory device; and a controller for controlling the nonvolatile memory device. The nonvolatile memory device includes: a memory cell array including a selected transistor and first and second memory cells between selected memory cells; and a program controller for controlling a program operation of the selected memory cell. In these embodiments, the program controller is configured such that a local voltage is applied to the second memory cell after being applied to the first memory cell, during the program operation of the selected memory cell.

In still further embodiments, the nonvolatile memory and the controller may be a solid-state drive (SSD) or a memory card.

DETAILED DESCRIPTION OF EMBODIMENTS

Figure 1:
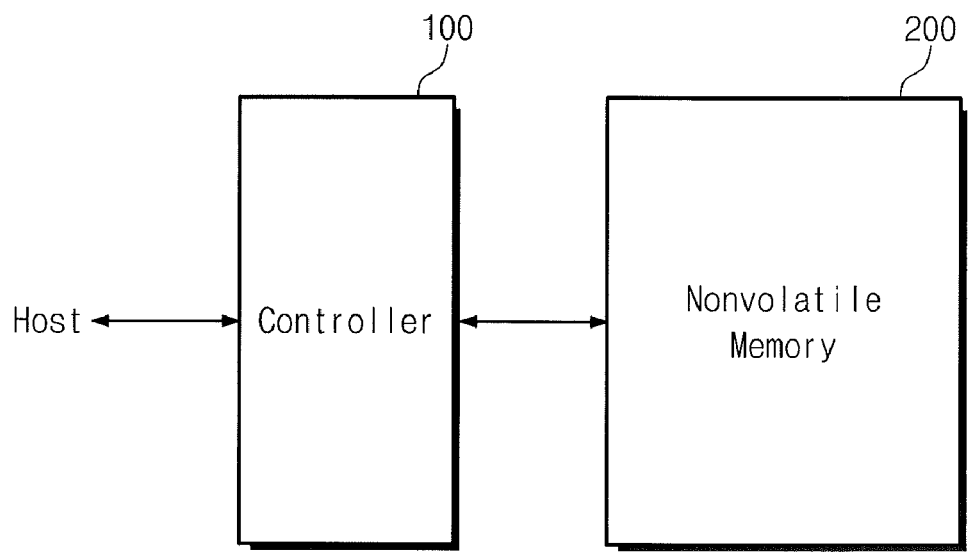
FIG. 1 is a block diagram illustrating a memory system according to some embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be discussed herein with respect to FIGS. 1 through 25, programming methods of nonvolatile memory devices in accordance with some embodiments include: applying a local voltage to a first unselected word line; applying a local voltage to a second unselected word line, after the local voltage is applied to the first unselected word line; and applying a pass voltage to the first unselected word line, after the local voltage is applied to the second unselected word line.

Nonvolatile memory devices in accordance with some embodiments include: a memory cell array including a selected transistor and first and second memory cells between selected memory cells; and a program controller for controlling a program operation of the selected memory cell. In these embodiments, the program controller is configured such that a local voltage is applied to the second memory cell after being applied to the first memory cell, during the program operation of the selected memory cell.

Memory systems in accordance with some embodiments include: a nonvolatile memory device; and a controller for controlling the nonvolatile memory device. The nonvolatile memory device includes: a memory cell array including a selected transistor and first and second memory cells between selected memory cells; and a program controller for controlling a program operation of the selected memory cell. In these embodiments, the program controller is configured such that a local voltage is applied to the second memory cell after being applied to the first memory cell, during the program operation of the selected memory cell.

Exemplary embodiments will be discussed herein with reference to the accompanying drawings. Embodiments discussed herein may, however, be embodied in many different forms and should not be construed as being limited to the embodiments set forth herein. Rather, these embodiments are provided so that this disclosure will be thorough and complete and will fully convey the scope of the embodiments to those skilled in the art.

Referring first to FIG. 1, a block diagram of a memory system 10 according to some embodiments will be discussed. As illustrated in FIG. 1, the memory system 10 includes a nonvolatile memory device 200, for example, a flash memory, and a controller 100.

The controller 100 is connected to a host and the nonvolatile memory device 200. The controller 100 transmits data read from the nonvolatile memory device 200 to the host and stores the data to be transmitted from the host in the memory device 200.

The controller 100 may include components such as a RAM, a processing unit, a host interface, and a memory interface. The RAM may be used as an operating memory of the processing unit. The processing unit may control the general operation of the controller 100.

The host interface may include a protocol for exchanging data between the host and the controller 110. For example, the controller 100 may be configured to communicate with an external device (host) via one of various interface protocols such as a Universal Serial Bus (USB), a Multimedia Card (MMC), a Peripheral Component Interconnect-Express (PCI-E), an Advanced Technology Attachment (ATA), a Serial-ATA, a Parallel-ATA, a Small Computer System Interface (SCSI), an Enhanced Small Device Interface (ESDI), and an Integrated Drive Electronics (IDE).

The memory interface may interface with the flash memory device 200. The controller 100 may further include an error correction block. The error correction block may detect and correct an error of data read from the nonvolatile memory device 200.

The nonvolatile memory device 200 may include a memory cell array for storing data, a read/write circuit for reading and writing data in the memory cell array, an address decoder for decoding an address transmitted from an external device and transmitting the address to the read/write circuit, and a control logic for controlling the general operation of the flash memory device. The nonvolatile memory device 200 will be discussed further with reference to FIG. 2.

The controller 100 and the nonvolatile memory device 200 may be integrated into one semiconductor device. For example, the controller 100 and the nonvolatile memory device 200 are integrated into one semiconductor device to configure a memory card. For example, the controller 100 and the nonvolatile memory device 200 may be integrated into one semiconductor device to configure a Personal Computer (PC) card (PCMCIA), a Compact Flash (CF) card, a Smart Media card (SM/SMC), a memory stick, a multimedia card (MMC, RS-MMC, or MMCmicro), a Secure Digital (SD) card (SD, miniSD, or microSD), or a Universal Flash Storage (UFS).

Alternatively, the controller 100 and the nonvolatile memory device 200 may be integrated into one semiconductor device to configure a Solid State Disk/Drive (SSD). If the memory system 10 is used as the solid state disk (SSD), the operation rate of the host connected to the memory system 10 may be remarkably improved.

In further embodiments, the memory system 10 is applicable to a computer, a portable computer, UMPC, a workstation, a net-book, a personal digital assistant (PDA), a web tablet, a wireless phone, a mobile phone, a smart phone, a digital camera, a digital picture/video recorder/player, a device for transmitting/receiving information in a wireless environment, one of various electronic devices configuring a home network, one of various electronic devices configuring a computer network, one of various electronic devices configuring a telematics network, or one of various electronic devices configuring a computing system, such as a solid state drive (SSD) or a memory card.

In some embodiments, the nonvolatile memory device 200 or the memory system 10 may be mounted in various package forms. For example, the nonvolatile memory device 200 or the memory system 10 may be packaged and mounted in one of various manners such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual hi-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

For brevity of the description, embodiments will be described with reference to the flash memory device. That is, it is assumed that the nonvolatile memory device 200 is the flash memory device. However, the nonvolatile memory device 200 according to embodiments is not limited to the flash memory device. For example, it will be understood that embodiments discussed herein may be applicable to the nonvolatile memory device such as ROM, PROM, EPROM, EEPROM, flash memory, MRAM, PRAM, RPAM, or FRAM.

Figure 2:
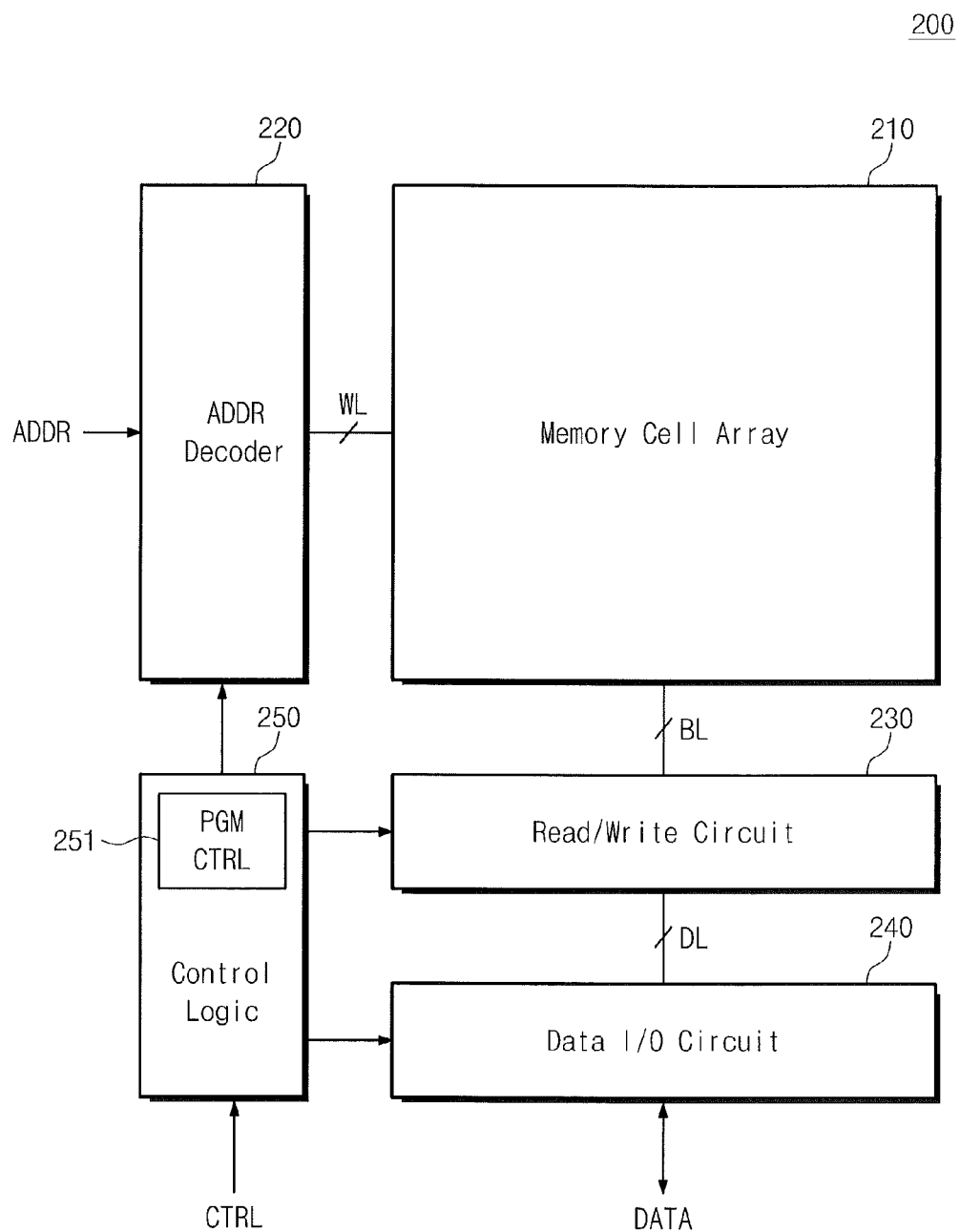
FIG. 2 is a block diagram illustrating a flash memory device of FIG. 1.

Referring now to FIG. 2, a block diagram of the flash memory device 200 of FIG. 1 will be discussed. As illustrated in FIG. 2, the flash memory device 200 according to some embodiments includes a memory cell array 210, an address decoder 220, a read/write circuit 230, a data input/output (I/O) circuit 240, and control logic 250.

The memory cell array 210 is connected to the address decoder 220 through word lines WLs and is connected to the read/write circuit 230 through bit lines BLs. The memory cell array 210 includes a plurality of memory cells arranged in the form of matrix. Data may be written and read in the memory cell corresponding to the word line selected by the address decoder 220 and the bit line selected by the read/write circuit 230. The memory cell array 210 will be discussed further with reference to FIG. 3.

The address decoder 220 operates in response to the control of the control logic 250. The address decoder 220 receives an address ADDR from an external device. For example, the address decoder 220 receives the address ADDR from the controller 100 of FIG. 1. The address decoder 220 decodes a row address of the address ADDR received from the external device and selects the word lines WLs. The address decoder 220 decodes a column address of the address ADDR received from the external device and provides the column address to the read/write circuit. For example, the address decoder 220 may include components such as an address buffer, a row address decoder, and a column address decoder.

The read/write circuit 230 is connected to the memory cell array 210 through the bit lines BLs and connected to the data I/O circuit 240 through the data lines DLs. The read/write circuit 230 operates in response to the control of the control logic 250. The read/write circuit 250 selects the bit lines BLs in response to the decoded column address to be transmitted from the address decoder 220.

The read/write circuit 230 writes the data, which are transmitted from the data I/O circuit 240 through data lines DLs, in the memory cell array 210. The read/write circuit 230 may transmit the data read from the memory cell array 210 to the data I/O circuit 240 through the data lines DLs. As another example, the read/write circuit 230 may write the data read from a first storage region of the memory cell array 210 in a second storage region of the memory cell array 210.

The read/write circuit 230 may include components such as a page buffer and a column selection circuit. As another example, the read/write circuit 230 may include components such as a write driver, a sense amplifier, and a column selection circuit.

The data I/O circuit 240 is connected to the read/write circuit 230 through the data lines DLs. The data I/O circuit 240 exchanges the data DATA with an external device. For instance, the data I/O circuit 240 may exchange the data DATA with the controller 100 of FIG. 1. The data I/O circuit 240 may transmit the data DATA exchanged with the external device to the read/write circuit 230 through the data lines DLs. The data I/O circuit 240 operates in response to the control of the control logic 250. The data I/O circuit 240 may include components such as a data buffer.

The control logic 250 is connected to the address decoder 220, the read/write circuit 230, and the data I/O circuit 240. The control logic 250 controls the general operation of the flash memory device 200. The control logic 250 operates in response to a control signal CTRL to be transmitted from the external device. For example, the control signal CTRL may be provided from the controller 100 of FIG. 1.

The control logic 250 includes a program controller 251 controlling the program operation of the flash memory device 200. The program controller 251 according to some embodiments discussed herein reduces or possibly prevents program disturbances that may be generated during the program operation. The program controller 251 may provide a program technique that improves boosting efficiency in program-inhibited channels. Therefore, it can reduce or possibly prevent the program disturbance from being generated by the program voltage.

The program controller 251 is configured to apply a local voltage to a first unselected word line during the program operation for a selection memory cell of the memory cell array 210, apply a local voltage to a second unselected word line after the local voltage is applied to the first unselected word line, and apply a pass voltage to the first unselected word line after the local voltage is applied to the second unselected word line. The program operation of the program controller 251 will be discussed further with reference to FIGS. 3 through 10.

Figure 3:
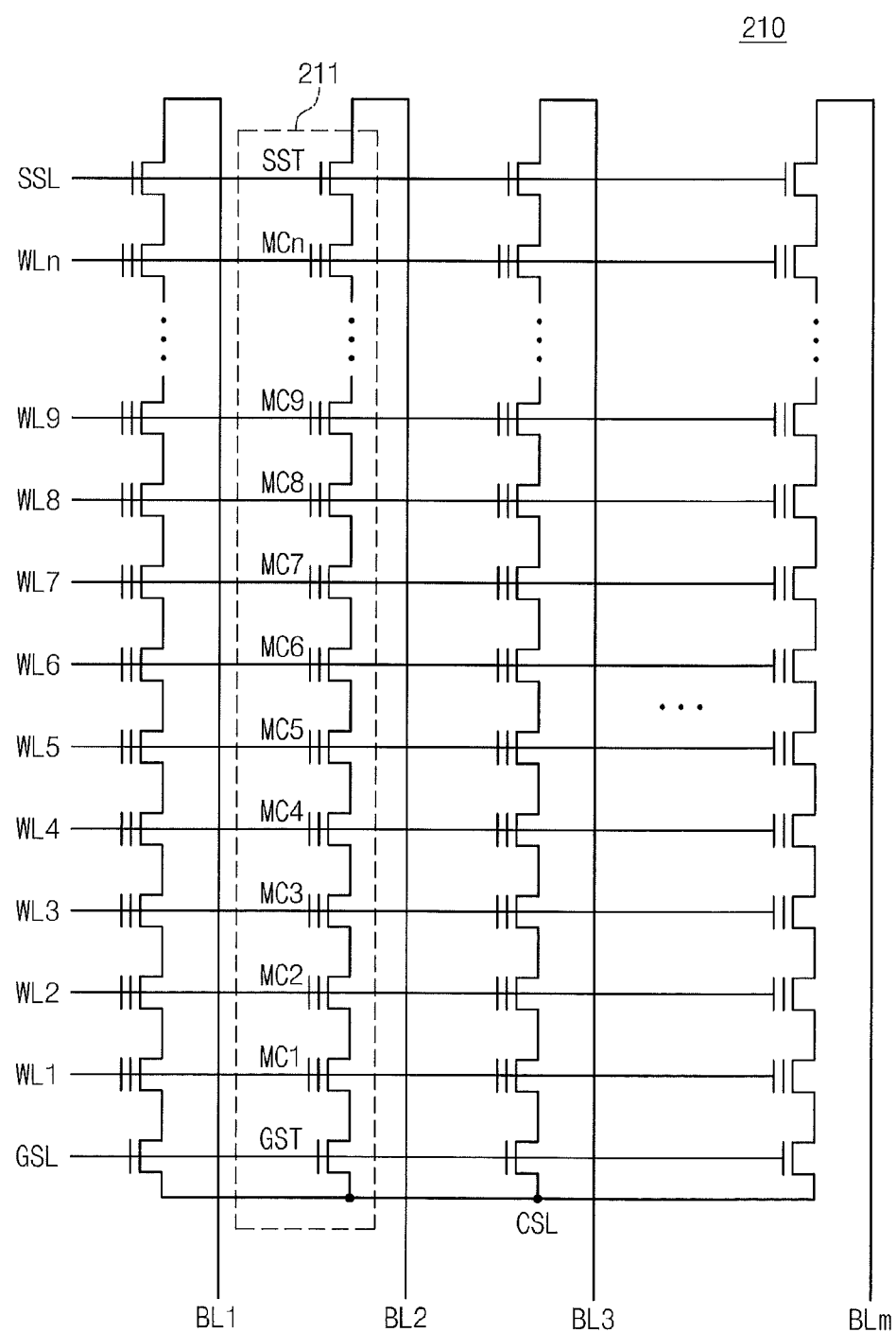
FIG. 3 is a circuit diagram illustrating a memory cell array of the flash memory device of FIG. 2.

Referring now to FIG. 3, a circuit diagram illustrating the memory cell array 210 of the flash memory device 200 of FIG. 2 will be discussed. For brevity of the description, FIG. 3 illustrates one memory block of the plurality of memory blocks of the memory cell array 210. As illustrated in FIG. 3, the memory cell array 210 includes a string selection transistor SST, a ground selection transistor GST, and memory cells MC1 to MCn connected between the string selection transistor SST and the ground selection transistor GST in series.

Drain and source of the string selection transistor SST are connected to bit lines BL1 to BLm corresponding thereto. A gate of the string selection transistor SST is connected to a string selection line SSL. Drain and source of the ground selection transistor GST are connected to a common source line CSL. A gate of the ground selection transistor GST is connected to a ground selection line GSL. Control gates of the memory cells MC1 to MCn are connected to word lines WL1 to WLn corresponding thereto. Element 211 represents one string including the string selection transistor SST, the ground selection transistor GST, and the memory cells MC1 to MCn.

Figure 4:
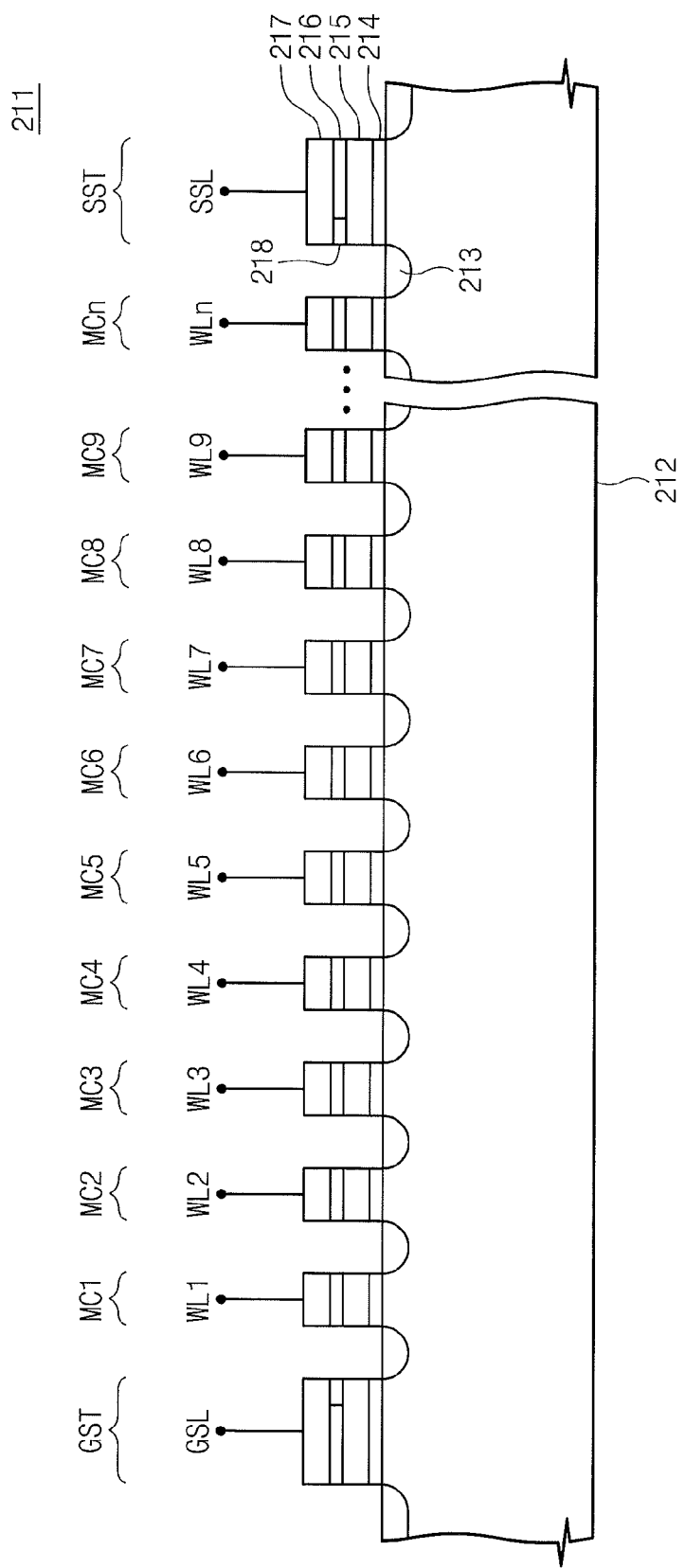
FIG. 4 is a cross section of one string in the memory cell array of FIG. 3.

Referring now to FIG. 4, a cross section illustrating one string of the memory cell array 210 of FIG. 3 will be discussed. As illustrated in FIG. 4, drain/source regions 213 are provided on a bulk region 212. The bulk region 212 may be a p-type doped well (p-well). The drain/source regions 213 may be n-type doped regions. Gate structures are provided on the bulk region 212 and between the drain/source regions 213.

The gate structures may include a tunnel insulation layer 214 on the bulk region 213. A charge storage layer 215 may be provided on the tunnel insulation layer 214. A blocking insulation layer 216 may be provided on the charge storage layer 215. A control gate 217 may be provided on the blocking insulation layer 216.

The bit line BL2 may be connected to the corresponding drain/source region of the string selection transistor SST. The bit line BL2 may be formed of a conductor such as tungsten (W). The common source line CSL (see FIG. 3) may be connected to the source/drain region of the ground selection transistor GST. The common source line CSL may be formed of a conductor such as a poly silicon.

In the tunnel layer 214, Fowler-Nordheim tunneling may occur between the channel region of the memory cells MC1 to MCn and the corresponding charge storage layer 215. Carriers, for example, electrons or holes, on the channel region of the memory cells MC1 to MCn may be accumulated or trapped in the corresponding charge storage layer 215 by electric field caused by the corresponding control gate 217.

The tunnel insulation layer may be formed of an insulator such as a silicon oxide or a silicon nitride.

The charge storage layer 215 may be formed of a conductor such as poly silicon. That is, the charge storage layer 215 may be a floating gate for accumulating charges. Alternatively, the charge storage layer 215 may be formed of an insulator such as a silicon oxide or a silicon nitride. That is, the charge storage layer 215 may be a charge trap for trapping charges.

The blocking insulation layer 216 blocks the flow of charges between the charge storage layer 215 and the control gate 217. The blocking insulation layer 216 may be formed of an insulator such as a silicon oxide or a silicon nitride. The control gate 217 receives the voltage through the word lines WL1 to WLn and the selection transistors SST and GST. The control gate 217 may be formed of a conductor such as poly silicon. The control gate 217 extends in a direction intersecting the bit lines BL1 to BLm to form the word lines WL1 to WLn and the selection transistors SST and GST.

The charge storage layer 215 and the control gate 217 of the selection transistors SST and GST may electrically be connected to each other through a via 218. That is, the selection transistors SST and GST may be configured to operate in a same manner as a general NMOS transistor. However, it will be understood that the charge storage layer 215 and the control gate 217 of the selection transistors SST and GST may electrically be isolated from each other.

As further illustrate in FIG. 4, the width of the selection transistors SST and GST is larger than that of the memory cells MC1 to MCn. However, it will be understood that the width of the selection transistors SST and GST is not limited thereto.

The gate structure of the memory cells MC1 to MCn and the selection transistors SST and GST includes the tunnel insulation layer 214, the charge storage layer 215, the blocking insulation layer 216, and the control gate 217. However, it will be understood that the gate structure is not limited thereto. For instance, a capping layer may be provided on the control gate 217, and sidewall spacers may additionally be provided at sidewalls of the gate structure.

For brevity of the description, it is assumed that the word line WL5 is selected for the program. In addition, it is assumed that the memory cell MC5 connected to the selected word line WL5, among the memory cells of the string 211, is a program-inhibited string.

Furthermore, it is assumed that the local voltage is a voltage for separating the channel of the memory cell MC5 connected to the selected word line WL5 from channels of other memory cells. For instance, when the local voltage is applied to the word line WL3, channels of the memory cells MC1 and MC2 may be, separated from channels of the memory cells MC4 to MCn. In some embodiments, when the local voltage is applied to the word line WL7, channels of the memory cells MC1 to and MC6 may be separated from channels of the memory cells MC8 to MCn.

Figure 5:
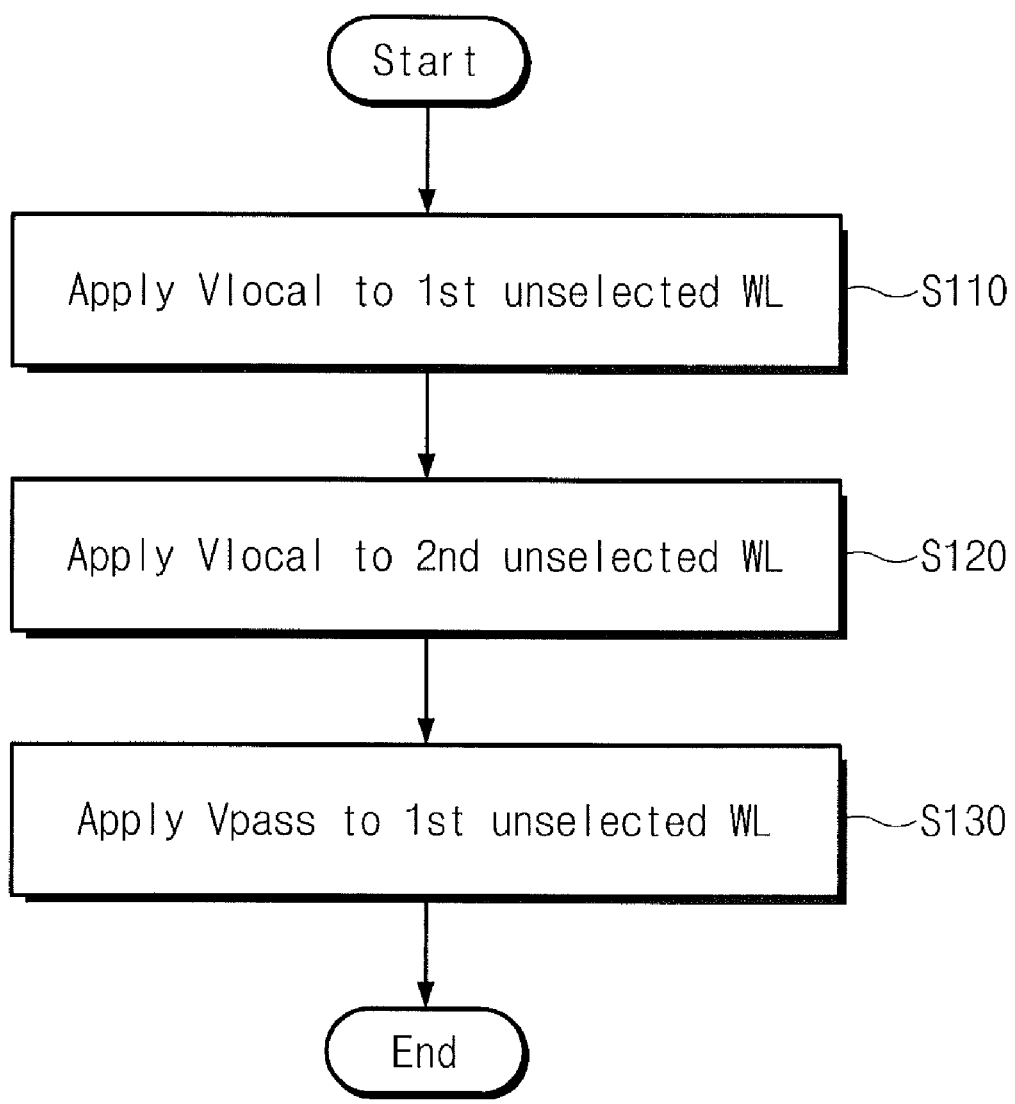
FIG. 5 is a flowchart illustrating a program operation by a program controller according to some embodiments.

Referring now to FIG. 5, a flowchart illustrating a program operation of a program controller according to some embodiments will be discussed. As illustrated in FIGS. 4 and 5, operations begin at block S110 by applying the local voltage Vlocal to a first unselected word line. The first unselected word line may be a word line locating between the selected word line WL5 and the selection transistor SST or GST. When the local voltage Vlocal is applied to the first unselected word line WL, channels of the memory cells MC1 to MCn of the string 211 will be separated on the basis of the first unselected word line WL. It assumes that the first unselected word line is the word line WL3.

The local voltage Vlocal is applied to a second unselected word line (block S120). The second unselected word line may be a word line located between the first unselected word line WL3 and the selection transistor SST or GST. Moreover, the second unselected word line may be a word line adjacent to the first unselected word line WL3. It is assumed that the second unselected word line is the word line WL2.

A pass voltage Vpass is applied to the first unselected word line WL3 (block S130). The pass voltage Vpass may be a voltage to be applied to unselected memory cells during the program operation. When the pass voltage Vpass is applied to the first unselected word line WL3, the first unselected word line WL3 may be turned on. That is, the channel including the selected memory cell MC5 may be changed from channels formed by the memory cells MC4 to MCn into channels formed by the memory cells MC3 to MCn.

When the bit line BL2 connected to the string 211 is biased to a voltage Vcc the pass voltage Vpass is applied to the memory cells MC1, MC2, and MC4 to MCn and the local voltage V local is applied to the memory cell MC3, the channel including the memory cell MC5 connected to the selected word line WL5 may be formed by the memory cells MC4 to MCn. Moreover, the boosting and floating of the channel formed by the memory cells MC4 to MCn may be performed by the pass voltage Vpass.

Then, when the local voltage Vlocal is applied to the memory cell MC3 and the pass voltage Vpass is applied to the memory cell MC3, the channel including the memory cell MC5 connected to the selected word line WL5 may be formed by the memory cells MC3 to MCn instead of being formed by the memory cells MC4 to MCn.

The number of carriers, for example, electrons or holes, in the floated channel may uniformly be maintained. The size of the channel including the memory cell MC5 connected to the selected word line WL5 may gradually increase from the channel formed by the memory cells MC4 to MCn to the channel formed by the memory cells MC3 to MCn. Since the number of carriers in the channel is uniformly maintained and the size of the channel increases, the density of the carriers in the channel may be decreased. Accordingly, it may be understood that the boosting efficiency of the program-inhibited string 211 increases.

Figure 6:
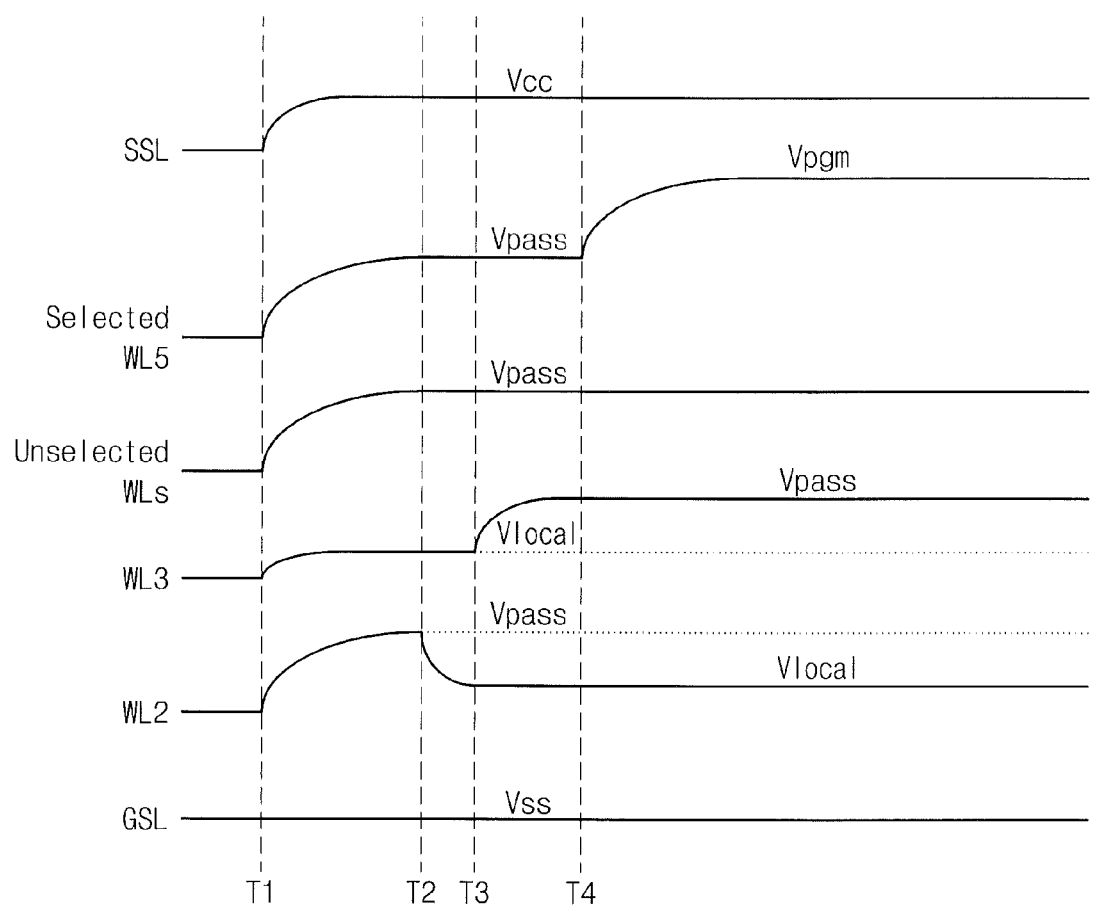
FIG. 6 is a timing diagram illustrating operations discussed with respect to FIG. 5 in accordance with some embodiments.

FIG. 6 is a timing diagram illustrating the program operation described with reference to FIG. 5. FIGS. 7 through 10 are diagrams illustrating a channel change in the string 211 according to the timing diagram of FIG. 6. Referring now to FIGS. 3, 4, 6, and 7, the local voltage Vlocal is applied to the word line WL3 at time T1. The pass voltage Vpass is applied to the selected word line WL5 and the word line WL2. Further, the pass voltage Vpass is applied to the unselected word lines. In FIG. 6, unselected word lines may indicate word lines WL1, WL4, and WL6 to WLn except for the word lines WL2, WL3, and WL5.

As illustrated in FIG. 6, the voltage Vcc is applied to the string selection line SSL, but the time is not defined. For instance, the voltage Vcc is applied to the string selection line SSL at T1 or before. The voltage Vcc may be applied to the bit line BL2 corresponding to the string 211. The voltage Vcc applied to the bit line BL2 may be a program prohibition voltage for the program-inhibited string 211. The voltage Vcc is applied to the bit line BL2 at T1 or before.

Figure 7:
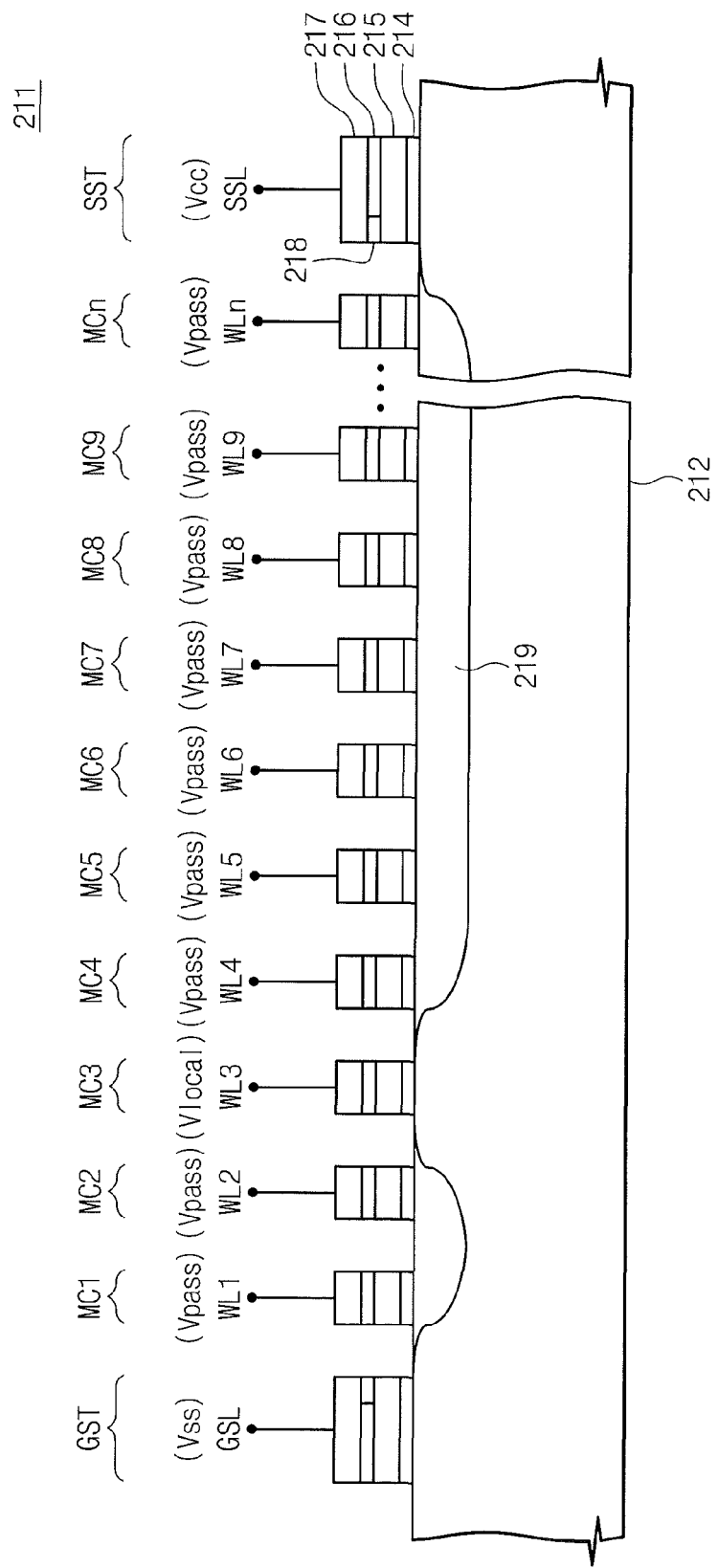
FIGS. 7 through 10 are cross sections illustrating a channel change in the string according to the timing diagram of FIG. 6.

At time T2, the pass voltage Vpass to be applied to the word lines WL1, WL2, and WL4 to WLn reaches a target level. For example, the local voltage Vlocal to be applied to the word line WL3 may reach the target level at time T2 or before. FIG. 7 illustrates that the channels are formed in the string 211 at time T2. In FIG. 7, for brevity of the description, the selection transistors SST and GST of the string 211 and the drain/source region of the memory cells MC1 to MCn are omitted, and the channels of the string 211 formed by the memory cells MC1 to MCn are illustrated.

Referring now to FIG. 7, the program prohibition voltage Vcc is applied to the bit line BL2, the voltage Vcc is applied to the string selection line SSL, and the pass voltage Vpass is applied to the word lines WL1, WL2, and WL4 to WLn, thereby forming the channels in the string 211. Since the local voltage Vlocal is applied to the word line WL3, the channels of the string 211 may be separated based on the word line WL3. That is, each of the channels may be formed by the memory cells MC1 and MC2 and the memory cells MC4 to MCn. A channel 219 including the memory cell MC5 connected to the selected word line WL5 is formed by the memory cells MC4 to MCn.

The channel 219 including the memory cell MC5 connected to the selected word line WL5 is floated by the string selection transistor SST and the memory cell MC3 to which the local voltage Vlocal is applied. That is, the number of carriers (ex., electrons or holes) in the channel 219 including the memory cell MC5 connected to the selected word line WL5 may uniformly be maintained.

Figure 8:
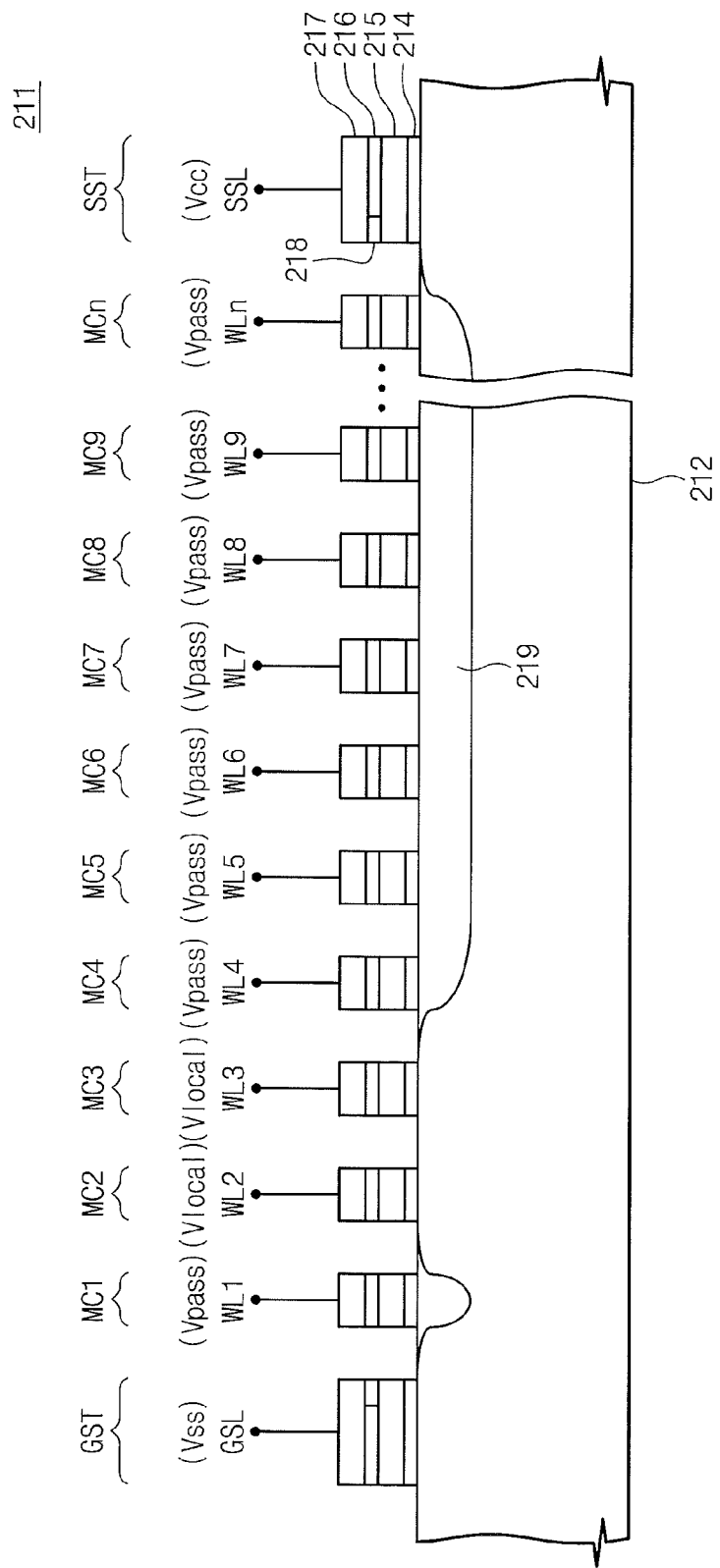

Referring again to FIGS. 3, 4 and 6, the local voltage Vlocal is applied to the word line WL2 at time T2, instead of the pass voltage Vpass. At time T3, the voltage of the word line WL2 reaches a target level of the local voltage Vlocal. That is, at time T3, the voltage of the word lines WL2 and WL3 is a target voltage level of the local voltage Vlocal. FIG. 8 illustrates that the channels are formed in the string 211 at time T3.

Referring to FIG. 8, since the local voltage Vlocal is applied to the word lines WL2 and WL3, the channels of the string 211 are separated by the memory cells MC2 and MC3. As in time T2, the channel 219 including the memory cell MC5 connected to the selected word line WL5 is formed by the memory cells MC4 to MCn. The channel 219 including the memory cell MC5 connected to the selected word line WL5 maintains the floating state by the string selection transistor SST and the memory cells MC2 and MC3. The density of carriers (ex., electrons or holes) in the channel 219 including the memory cell MC5 connected to the selected word line WL5 may be maintained so as to be the same as that in time T2.

Figure 9:
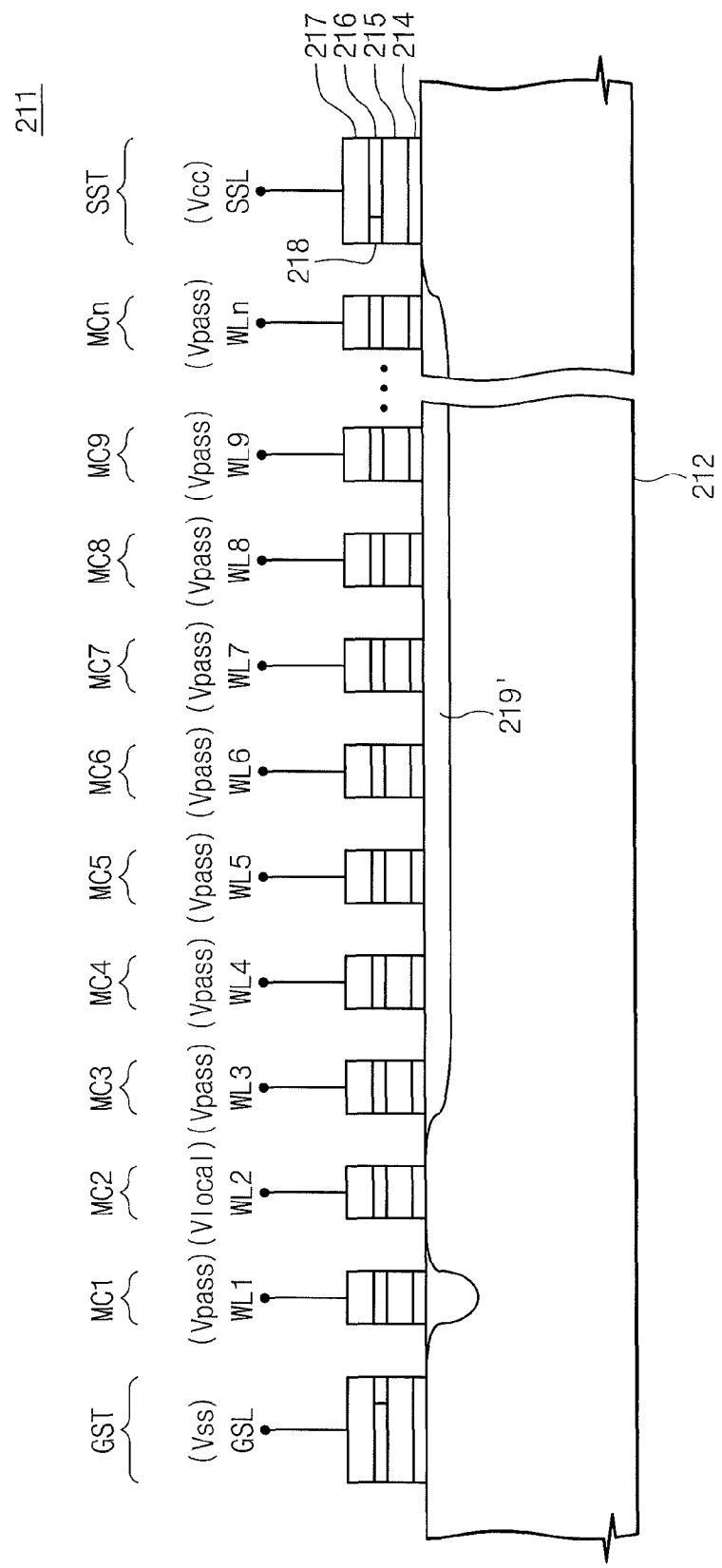

Referring again to FIGS. 3, 4 and 6, the pass voltage Vpass is applied to the word line WL3 at time T3, instead of the local voltage Vlocal. At time T4, the voltage of the word line WL3 reaches a target level of the pass voltage Vpass. That is, the channel corresponding to the memory cell MC3 connected to the word line WL3 may be formed in the string 211. In addition, the channels of the string 211 may be separated by the memory cell MC2 connected to the word line WL2 to which the local voltage Vlocal is applied. FIG. 9 illustrates that the channels are formed in the string 211 at time T4.

Referring to FIG. 9, the local voltage Vlocal is applied to the word lines WL2, and the pass voltage Vpass is applied to the word line WL3. The channel 219 including the memory cell MC5 connected to the selected word line WL5 is formed by the memory cells MC4 to MCn in FIG. 8 illustrating the channel of the string 211 at time T3, while a channel 219' including the memory cell MC5 connected to the selected word line WL5 is formed by the memory cells MC3 to MCn in FIG. 9 illustrating the channel of the string 211 at time T4.

Between T3 and T4, the channel 219 including the memory cell MC5 connected to the selected word line WL5 maintains the floating state. That is, the number of carriers (ex., electrons or holes) in the channel 219 including the memory cell MC5 connected to the selected word line WL5 may uniformly be maintained at time T3 and T4. On the other hand, the size of the channel including the memory cell MC5 connected to the selected word line WL5 may gradually increase from the channel formed by the memory cells MC4 to MCn to the channel formed by the memory cells MC3 to MCn between T3 and T4.

To summarize, the size of the channel including the memory cell MC5 connected to the selected word line WL5 increases, while the number of carriers (electrons or holes) in the channel is uniformly maintained between T3 and T4. That is, it may be understood that the density of the carriers in the channel including the memory cell MC5 connected to the selected word line WL5 decreases between T3 and T4.

Figure 10:
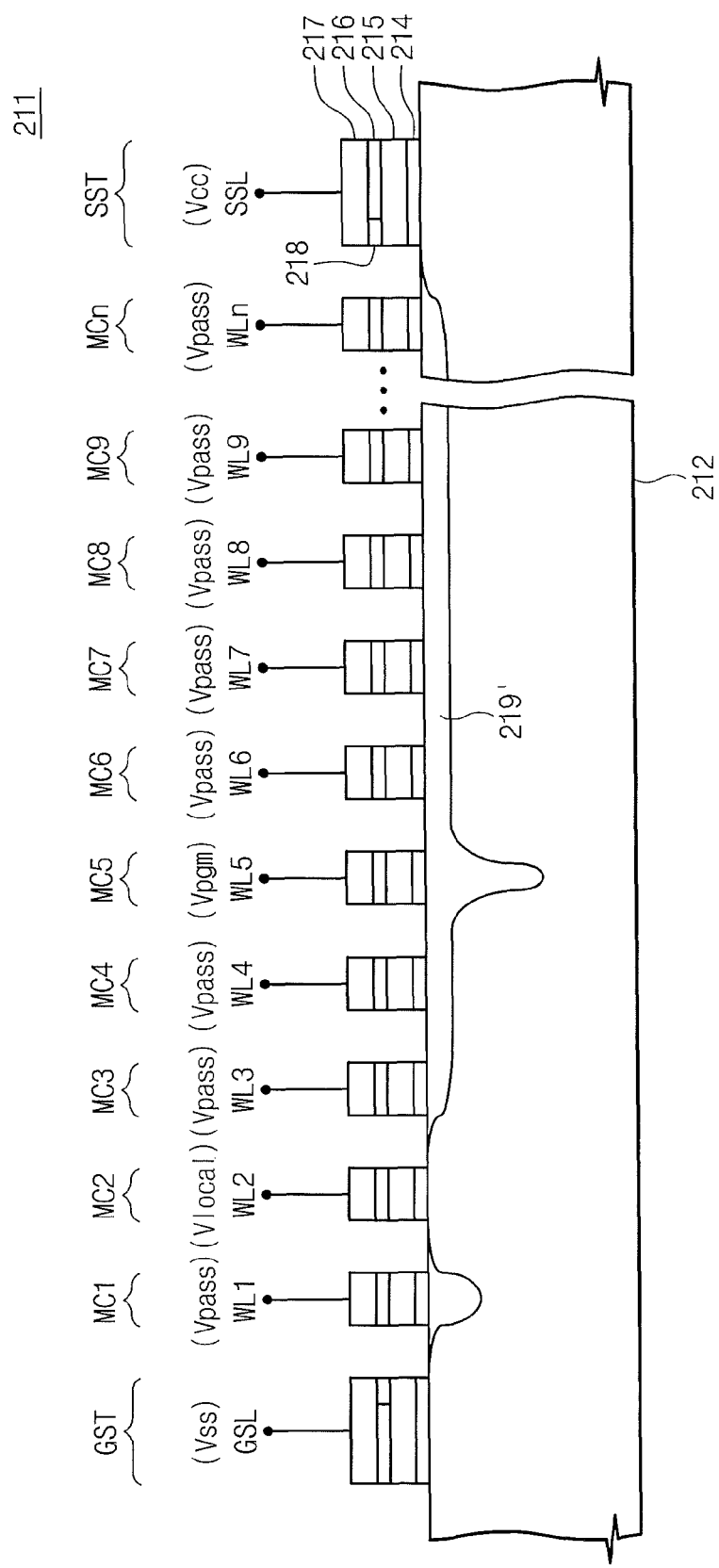

Referring again to FIGS. 3, 4 and 6, a program voltage Vpgm is applied to the selected word line WL5 at time T4. FIG. 10 illustrates that the channels are formed in the string 211 when the program voltage Vpgm is applied to the selected word line WL5.

Referring to FIG. 10, the channel 219' including the memory cell MC5 connected to the selected word line WL5 is formed by the memory cells MC3 to MCn, and the program voltage Vpgm is applied to the selected word line MC5. Generally, the program voltage Vpgm has higher level than the pass voltage Vpass. Therefore, when the program voltage Vpgm is applied to the selected word line WL5, the channel corresponding to the selected word line WL5 becomes deeper in depth.

In time interval T2~T4 described with reference to FIG. 6, the word line to which the local voltage Vlocal is applied is changed into the word line WL2 from the word line WL3. Due to the change of the word line to which the local voltage Vlocal is applied, the density of carriers in the channel 219' including the memory cell MC5 connected to the selected word line WL5 decreases. As the density of carriers in the channel decreases, the boosting efficiency increases. Accordingly, the boosting efficiency is large when the program voltage Vpgm is applied to the selected word line WL5 compared to the boosting efficiency when the word line to which the local voltage Vlocal is applied is not changed. Therefore, it may decrease the probability of occurrence of the program disturbance at the selected word line WL5 due to the program voltage Vpgm.

When the density of carriers in the channel 219' decreases, the number of carriers, which suffers the coupling influence from the program voltage Vpgm applied to the selected word line WL5, may decrease. As the number of carriers suffering the coupling influence from the program voltage Vpgm decreases, the influence of the program voltage Vpgm on a unit carrier may increase. That is, as the density of carriers in the channel 219' decreases, the voltage of the carriers influenced by the program voltage Vpgm may increase in ascending degree due to the influence of the program voltage Vpgm.

Assuming that the region influenced by the program voltage Vpgm is a channel region corresponding to the memory cell MC5 connected to the selected word line WL5, the voltage level of the channel region corresponding to the memory cell MC5 may ascend, as the density of carriers in the channel 219' decreases. That is, as the density of carriers in the channel 219' decreases, it may decrease the probability of occurrence of a soft program, that is, the program disturbance, due to the program voltage Vpgm in the memory cell MC5 connected to the selected word line WL5.

After the voltage level of the channel region corresponding to the memory cell MC5 ascends, a charge sharing may be generated in the channel region corresponding to other memory cells MC3, MC4, and MC6 to MCn. Due to the charge sharing, the voltage level of the channel region corresponding to the memory cell MC5 may lower. The charge sharing is generated by the carriers in the channel 219'. That is, as the density of carriers in the channel 219' lowers, the influence of the charge sharing may decrease.

As the density of carriers in the channel 219' lowers, the voltage level of the channel region corresponding to the memory cell MC5 may become slow in descending rate. That is, as the density of carriers in the channel 219' lowers, the voltage of the channel region corresponding to the memory cell MC5 maintains a high level. Accordingly, as the density of carriers in the channel 219' lowers, it may be understood that the soft program, that is, the program disturbance, due to the program voltage Vpgm may decrease.

As illustrated in FIG. 6, the voltage of the selected word line WL5 reaches the target level of the pass voltage Vpass at time T2, and the local voltage is applied to the word line WL2 at time T2. However, after the voltage of the channel including the memory cell MC5 connected to the selected word line WL5 is boosted as much as a predetermined level by the pass voltage Vpass, the local voltage is applied to the word line WL2, but is not limited thereto. In order that the channel 219 is boosted as much as a predetermined level by the pass voltage Vpass, after each voltage of the selected word line WL5, the word line WL2, and the unselected word lines WL1, WL3, WL4, and WL6 to WLn reaches the target level of the pass voltage Vpass, the local voltage Vlocal may be applied to the word line WL2.

As further illustrated in FIG. 6, the voltage of the word line WL2 reaches the target level of the local voltage Vlocal at time T3, and the pass voltage Vpass is applied to the word line WL3 at time T3. However, after the voltage of the word line WL2 separates the channels of the string 211, the pass voltage Vpass is applied to the word line WL3, but is not limited thereto. In order to maintain the channel 219 including the memory cell MC5 connected to the selected word line WL5 at the floating state, after the voltage of the word line WL2 reaches the target level of the local voltage Vlocal, the pass voltage Vpass may be applied to the word line WL3.

As still further illustrated in FIG. 6, the voltage of the word line WL3 reaches the target level of the pass voltage Vpass at time T4, and the program voltage Vpgm is applied to the selected word line WL5 at time T4. However, after the voltage of the word line WL3 increases such that the channel 219' including the memory cell MC5 extends to the channel region corresponding to the memory cell MC3, the program voltage Vpgm is applied to the selected word line WL5, but is not limited thereto. In order to reduce the density of carriers in the channel 219' including the memory cell MC5 connected to the selected word line WL5, after the voltage of the word line WL3 reaches the target level of the pass voltage Vpass, the program voltage Vpgm may be applied to the selected word line WL5.

As discussed above with respect to FIGS. 6 through 10, the local voltage Vlocal may be applied to the word lines WL2 and WL3 spaced at more than a predetermined distance from the selected word line WL5 to which the program voltage Vpgm is applied. The distance between the word line to which the program voltage Vpgm is applied and the word line to which the local voltage Vlocal is applied may be set to minimize the program disturbance, leakage, and unintended coupling, but is not limited thereto.

As further discussed above, the flash memory device 200 changes the word line to which the local voltage Vlocal is applied during the program operation into the second word line from the first word line. By changing the word line to which the local voltage Vlocal is applied, the flash memory device according to some embodiments discussed herein can reduce the density of carriers in the channel 219' including the memory cell MC5 connected to the selected word line WL5 of the program-inhibited string 211. Accordingly, the flash memory device 200 can reduce or possibly prevent the soft program, that is, the program disturbance caused by the program voltage Vpgm.

For brevity of the description, it refers to an operation for changing the word line (or memory cell) to which the local voltage Vlocal is applied during the program operation as a squeeze operation. More specifically, in order to reduce the density of carriers in the channel 219' including the memory cell MC5 connected to the selected word line WL5 of the program-inhibited string 211, it refers to an operation for changing the word line (or memory cell) to which the local voltage Vlocal is applied during the program operation as a squeeze operation.

Figure 11:
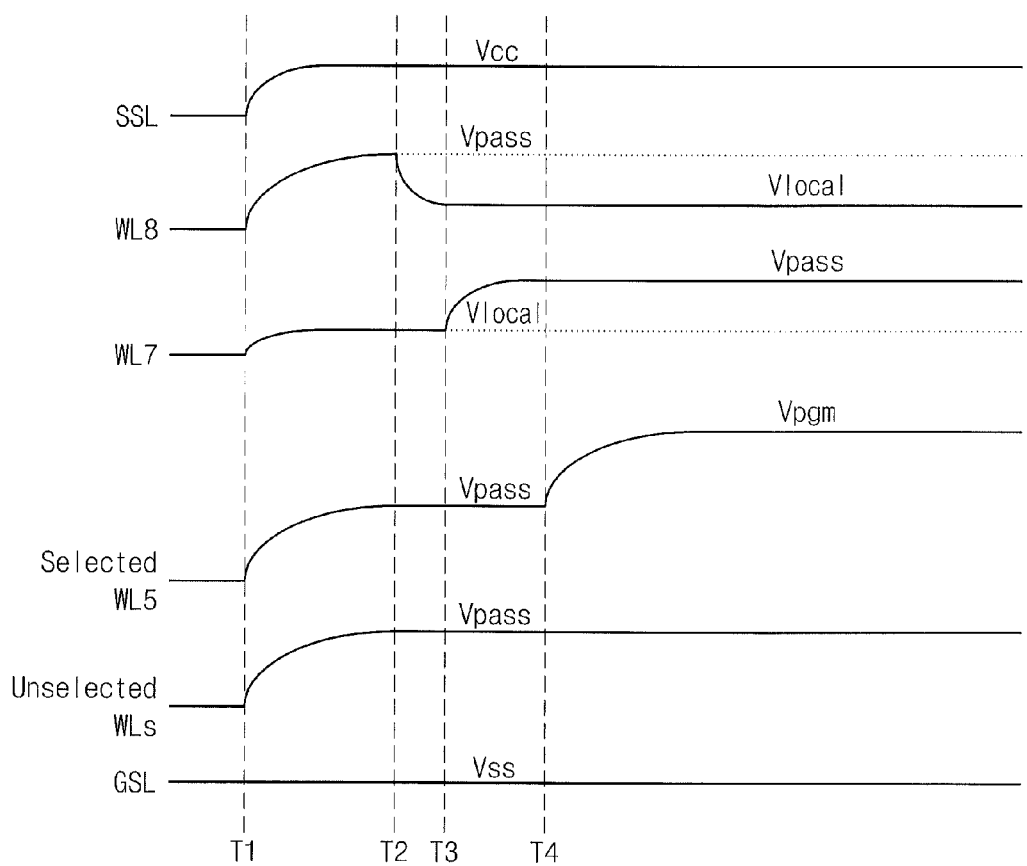
FIG. 11 is a timing diagram illustrating operations with respect to FIG. 5 in accordance with some embodiments.

Referring now to FIG. 11, a timing diagram illustrating some embodiments of the program operation described with reference to FIG. 5 will be discussed. As illustrated in FIG. 11, unselected word lines may indicate the word lines WL1 to WL4, WL6, and WL9 to WLn except for the word lines WL5, WL7, and WL8.

Referring now to FIGS. 3, 4, and 11, the pass voltage Vpass is applied to the selected word line WL5, the word line WL8, and the unselected word lines WL1 to WL4, WL6, and WL9 to WLn at time T1. Furthermore, the local voltage Vlocal is applied to the word line WL7 at time T1. The voltage Vcc may be applied to the string selection line SSL, and a ground voltage Vss may be applied to the ground selection line GSL. The voltage Vcc is applied to the string selection line SSL at T1 or before, but is not limited thereto. The voltage Vcc may be applied to the bit line BL corresponding to the string 211. The voltage Vcc is applied to the bit line BL at T1 or before, but is not limited thereto.

At time T2, the voltage of the word lines WL1 to WL6 and WL8 to WLn reaches the target level of the pass voltage Vpass. The voltage of the word line WL7 may reach the target level of the local voltage Vlocal at time T2 or before. Due to the pass voltage Vpass applied to the word lines WL1 to WL6 and WL8 to WLn, the channel may be formed in the string 211. The channel formed in the string 211 may be separated by the local voltage Vlocal applied to the word line WL7. The channel including the memory cell MC5 connected to the selected word line WL5 may be formed by the memory cells MC1 to MC6.

The local voltage Vlocal is applied to the word line WL8 at time T2. At time T3, the voltage of the word line WL8 reaches the target level of the local voltage Vlocal, and the pass voltage Vpass is applied to the word line WL7. At time T4, the voltage of the word line WL7 reaches the target level of the pass voltage Vpass, and the program voltage Vpgm is applied to the selected word line WL5.

That is, the channel including the memory cell MC5 connected to the selected word line WL5 is changed from a channel formed by the memory cells MC1 to MC7 into a channel formed by the memory cells MC1 to MC6. Due to changing the word line (or memory cell) in which the local voltage Vlocal is applied, it can increase the size of the channel including the memory cell MC5 connected to the selected word line WL5. This cause the density of carriers in the channel including the memory cell MC5 connected to the selected word line WL5 to decrease, thereby improving the boosting efficiency of the string 211.

The local voltage is applied between the selected word line and the ground selection line by the squeeze operation described with reference to FIG. 6. The local voltage is applied between the selected word line and the string selection line by the squeeze operation described with reference to FIG. 11. The above-described squeeze operation (as described with reference to FIGS. 6 and 7) may selectively be applied according to the distance between the selected word line and the string selection line, the distance between the selected word line and the ground selection line, and data pattern previously programmed in the related string.

Figure 12:
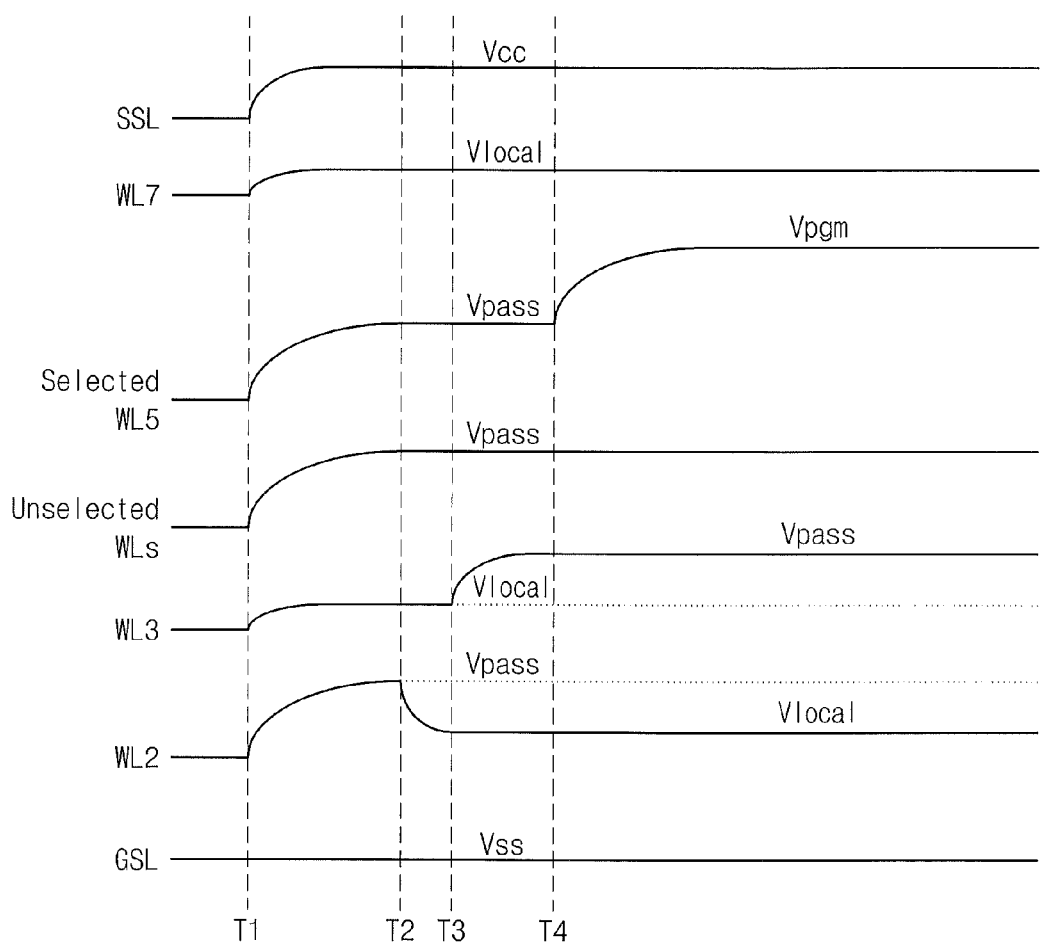
FIG. 12 is a timing diagram illustrating operations with respect to FIG. 5 in accordance with some embodiments.

Referring now to FIG. 12, a timing diagram illustrating some embodiments of program operations with respect to FIG. 5 will be discussed. As illustrated in FIG. 12, the unselected word lines may indicate the word lines WL1, WL4, WL6, and WL8 to WLn except for the word lines WL2, WL3, WL5, and WL7.

Referring now to FIGS. 3, 4, and 12, the pass voltage Vpass is applied to the selected word line WL5, the word line WL2, and the unselected word lines WL1, WL4, WL6, and WL8 to WLn at time T1. Furthermore, the local voltage Vlocal is applied to the word lines WL3 and WL7 at time T1. The voltage Vcc may be applied to the string selection line SSL, and a ground voltage Vss may be applied to the ground selection line GSL. The time voltage Vcc is applied to the string selection line SSL at T1 or before, but is not limited thereto. The voltage Vcc may be applied to the bit line BL corresponding to the string 211. The voltage Vcc is applied to the bit line BL at T1 or before, but is not limited thereto.

At time T2, the voltage of the word lines WL1, WL2, WL4 to WL6, and WL8 to WLn reaches the target level of the pass voltage Vpass. The voltage of the word lines WL3 and WL7 may reach the target level of the local voltage Vlocal at time T2 or before. Due to the pass voltage Vpass applied to the word lines WL1, WL2, WL4 to WL6, and WL8 to WLn, the channel may be formed in the string 211. The channel formed in the string 211 may be separated by the local voltage Vlocal applied to the word lines WL3 and WL7. The channel including the memory cell MC5 connected to the selected word line WL5 may be formed by the memory cells MC4 to MC6.

The local voltage Vlocal is applied to the word line WL2 at time T2. At time T3, the voltage of the word line WL2 reaches the target level of the local voltage Vlocal, and the pass voltage Vpass is applied to the word line WL3. At time T4, the voltage of the word line WL3 reaches the target level of the pass voltage Vpass, and the program voltage Vpgm is applied to the selected word line WL5.

That is, the channel including the memory cell MC5 connected to the selected word line WL5 is changed from a channel formed by the memory cells MC4 to MC6 into a channel formed by the memory cells MC3 to MC7. Due to changing the word line (or memory cell) in which the local voltage Vlocal is applied, it can increase the size of the channel including the memory cell MC5 connected to the selected word line WL5. This cause the density of carriers in the channel including the memory cell MC5 connected to the selected word line WL5 to decrease, thereby improving the boosting efficiency of the string 211.

Figure 13:
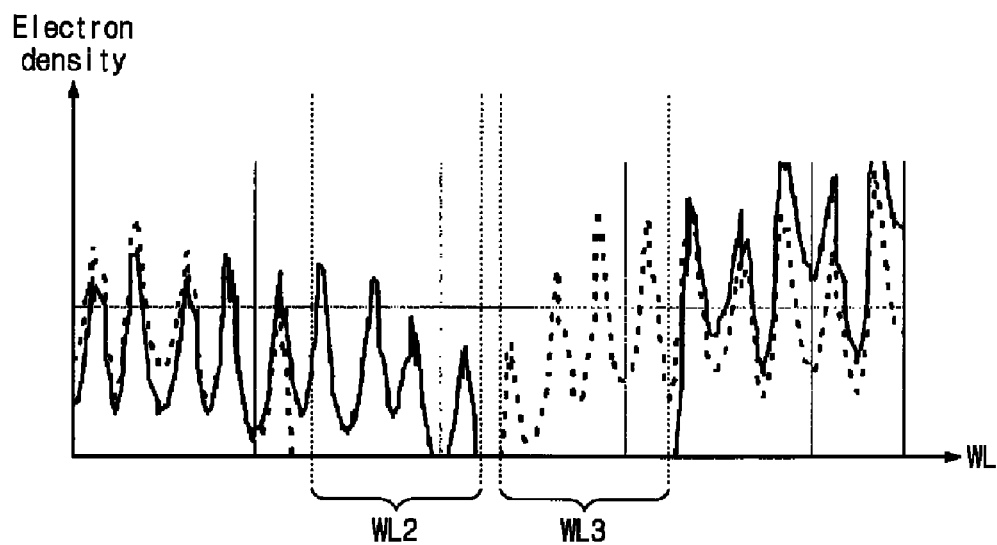
FIG. 13 is a diagram illustrating a change of electron density in the string according to embodiments discussed with respect to FIG. 12.

Referring now to FIG. 13, a diagram illustrating a change of electron density in the string according to the program operation described with reference to FIG. 12 will be discussed. As illustrated in FIG. 13, an x-axis indicates a channel region corresponding to the word line from the ground selection line GSL, and a y-axis indicates an electron density. In FIG. 13, a solid line indicates the electron density before the squeeze operation is performed, and a dotted line indicates the electron density after the squeeze operation is performed.

As illustrated in FIG. 13, referring to the solid line, electrons have no existence in the channel region corresponding to the word line WL3 before the squeeze operation is performed. That is, the solid line of FIG. 13 indicates that the channel region is in an off-state due to the local voltage Vlocal. As illustrated in FIG. 13, referring to the dotted line, the electrons exist in the channel region corresponding to the word line WL3, but the electrons have no existence in the channel region corresponding to the word line WL2. That is, the dotted line of FIG. 13 indicates that the word line to which the local voltage Vlocal is applied is changed into the word line WL2 from the word line WL3.

The word lines WL4 to WL6 may be located on the right side of the word line WL3. That is, the channel region of the right side of the word line WL3 may be a channel region including the memory cell MC5 connected to the selected word line WL5. In FIG. 13, comparing the before (solid line) and after (dotted line) of the squeeze operation, the electron density of the channel region including the memory cell MC5 connected to the selected word line WL5 reduces after the squeeze operation. That is, according to some embodiments discussed herein, it can reduce or possibly prevent the program disturbance caused by the program voltage Vpgm.

Figure 14:
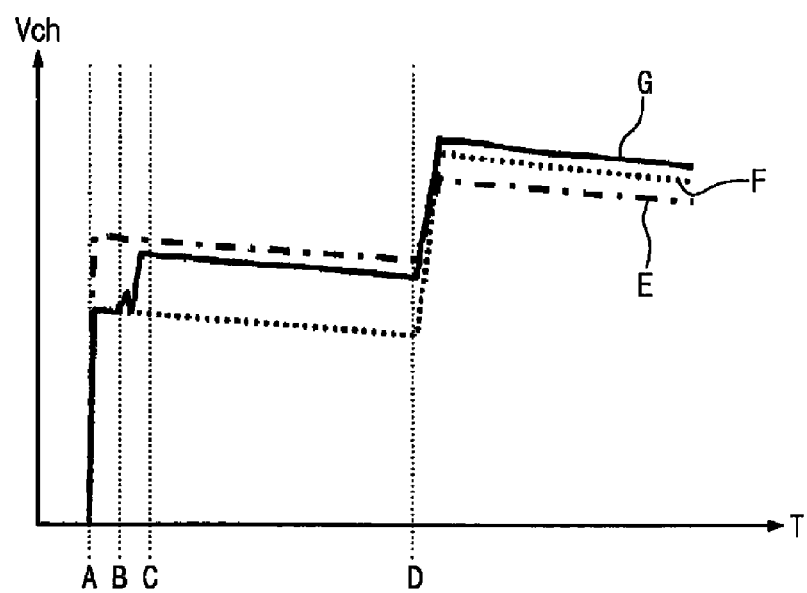
FIG. 14 is a diagram comparing the program operation described with reference to FIG. 12 with a conventional program operation.

Referring now to FIG. 14, a diagram illustrating a comparison the program operation described with reference to FIG. 12 with a conventional program operation. In FIG. 14, an x-axis indicates time, and a y-axis indicates the voltage of the channel including the memory cell MC5 connected to the selected word line WL5.

In FIG. 14, a line E indicates a channel voltage according to a first embodiment of the known local boosting operation. The first embodiment of the known local boosting operation includes: applying the pass voltage Vpass to the selected word line WL5, the unselected word line WL3, and the word lines other than the word lines WL3 and WL5; applying the ground voltage Vss to the unselected word line WL3; applying the local voltage Vlocal to the unselected word line WL3; and applying the program voltage Vpgm to the selected word line WL5. At Time D, the program voltage Vpgm may be applied to the selected word line WL5.

In FIG. 14, a line F indicates the channel voltage according to a second embodiment of the known local boosting operation. The second embodiment of the known local boosting operation includes: applying the pass voltage Vpass to the selected word line WL5, the unselected word lines WL3 and WL7, and the word lines other than the word lines WL3, WL5, and WL7; applying the ground voltage Vss to the unselected word lines WL3 and WL7; applying the local voltage Vlocal to the unselected word lines WL3 and WL7; and applying the program voltage Vpgm to the selected word line WL5. At Time D, the program voltage Vpgm may be applied to the selected word line WL5.

In FIG. 14, a line G indicates the channel voltage caused by the program operation according some embodiments described with reference to FIG. 12. Time A may correspond to time T1 described with reference to FIG. 12. That is, the pass voltage Vpass may be applied to the word lines WL1, WL2, WL4 to WL6, and WL8 to WLn, and the local voltage may be applied to the word lines WL3 and WL7. Since the boosting starts to occur due to the pass voltage Vpass to at time A, the voltage of the channel including the memory cell MC5 connected to the selected word line WL5 may start to ascend.

Time B may correspond to time T3 described with reference to FIG. 12. At time B, the pass voltage is applied to the word line WL3, and the density of carriers in the channel including the memory cell MC5 connected to the selected word line WL5 may reduce. Due to the influence of the pass voltage Vpass applied to the word line WL3 and the reduction of the density of carrier in the channel, the voltage of the channel including the memory cell MC5 connected to the selected word line WL5 may ascend.

Time D may correspond to time T4 described with reference to FIG. 12. At time D, the program voltage Vpgm may be applied to the selected word line WL5. The channel voltage may ascend by the program voltage Vpgm. The interval between C and D may be time until the density of carriers in the channel including the memory cell MC5 connected to the selected word line WL5 becomes lower (or stable).

As illustrated in FIG. 14, in the program operation according to some embodiments, the voltage of the channel including the memory cell MC5 connected to the selected word line WL5 is high compared to that of the channel caused by the known program operation. Therefore, the program operation according to some embodiments can reduce or possibly prevent the program disturbance.

Figure 15:
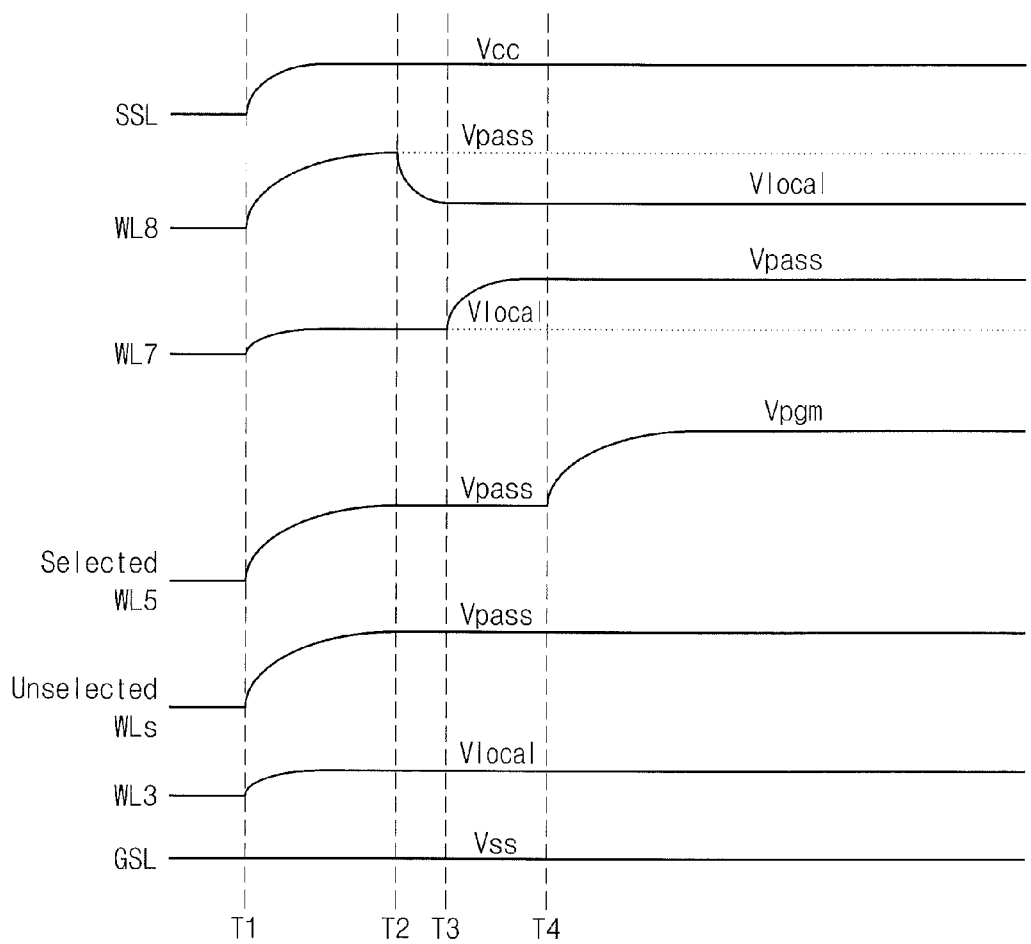
FIG. 15 is a timing diagram illustrating operations with respect to FIG. 5 in accordance with some embodiments.

Referring now to FIG. 15, a timing diagram illustrating some embodiments of the program operation described with reference to FIG. 5 will be discussed. As illustrated in FIG. 15, the unselected word lines may indicate the word lines WL3, WL5, WL7, and WL8 except for the word lines WL1, WL2, WL4, WL6, and WL9 to WLn.

Referring now to FIGS. 3, 4, and 15, the pass voltage Vpass is applied to the selected word line WL5, the word line WL8, and the unselected word lines WL1, WL2, WL4, WL6, and WL9 to WLn at time T1. Furthermore, the local voltage Vlocal is applied to the word lines WL3 and WL7 at time T1. The voltage Vcc may be applied to the string selection line SSL, and a ground voltage Vss may be applied to the ground selection line GSL. The voltage Vcc is applied to the string selection line SSL at T1 or before, but is not limited thereto. The voltage Vcc may be applied to the bit line BL corresponding to the string 211. The voltage Vcc is applied to the bit line BL at T1 or before, but is not limited thereto.

At time T2, the voltage of the word lines WL1, WL2, WL4 to WL6, and WL8 to WLn reaches the target level of the pass voltage Vpass. The voltage of the word lines WL3 and WL7 may reach the target level of the local voltage Vlocal at time T2 or before. Due to the pass voltage Vpass applied to the word lines WL1, WL2, WL4 to WL6, and WL8 to WLn, the channel may be formed in the string 211. The channel formed in the string 211 may be separated by the local voltage Vlocal applied to the word lines WL3 and WL7. The channel including the memory cell MC5 connected to the selected word line WL5 may be formed by the memory cells MC4 to MC6.

The local voltage Vlocal is applied to the word line WL8 at time T2. At time T3, the voltage of the word line WL8 reaches the target level of the local voltage Vlocal, and the pass voltage Vpass is applied to the word line WL7. At time T4, the voltage of the word line WL7 reaches the target level of the pass voltage Vpass, and the program voltage Vpgm is applied to the selected word line WL5.

That is, the channel including the memory cell MC5 connected to the selected word line WL5 is changed from a channel formed by the memory cells MC4 to MC6 into a channel formed by the memory cells MC3 to MC7. Due to changing the word line (or memory cell) in which the local voltage Vlocal is applied, it can increase the size of the channel including the memory cell MC5 connected to the selected word line WL5. This cause the density of carriers in the channel including the memory cell MC5 connected to the selected word line WL5 to decrease, thereby improving the boosting efficiency of the string 211.

The squeeze operation described with reference to FIGS. 6 and 11 allows the local voltage to be applied to the unselected word line between the selected word line and the selection line (string selection line or ground selection line), resulting in squeezing the local voltage.

The squeeze operation described with reference to FIGS. 12 and 15 allows the local voltage to be applied between the selected word line and the first selection line (string selection line or ground selection line) and allows the local voltage to be applied between the selected word line and the second selection line (string selection line or ground selection line), resulting in squeezing the local voltage.

That is, according to the squeeze operation described with reference to FIGS. 6 and 11, the local voltage is applied only between the first selection transistor and the selected line, while according to the squeeze operation described with reference to FIGS. 12 and 15, the local voltage is applied between the selected line and the first selection transistor or between the selected line and the second selection transistor. That is, the squeeze operation described with reference to FIGS. 12 and 15 may provide a high boosting effect compared to the squeeze operation described with reference to FIGS. 6 and 11.

Figure 16:
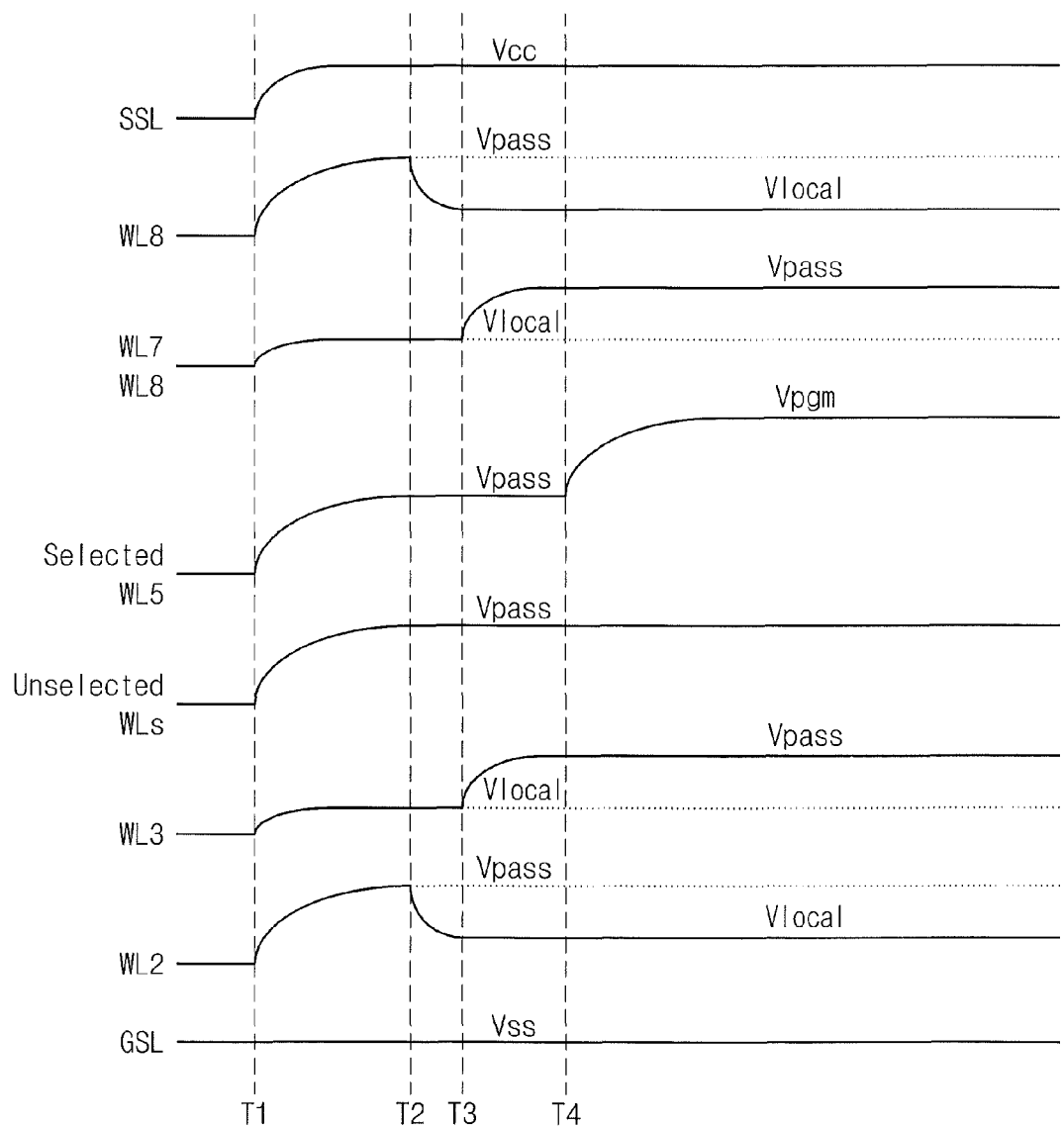
FIG. 16 is a timing diagram illustrating operations with respect to FIG. 5 in accordance with some embodiments.

Referring now to FIG. 16, a timing diagram illustrating some embodiments of the program operation described with reference to FIG. 5 will be discussed. As illustrated in FIG. 16, the unselected word lines may indicate the word lines WL2, WL3, WL5, WL7, and WL8 except for the word lines WL1, WL4, WL6, and WL9 to WLn.

Referring now to FIGS. 3, 4, and 16, the pass voltage Vpass is applied to the selected word line WL5, the word lines WL2 and WL8, and the unselected word lines WL1, WL4, WL6, and WL9 to WLn at time T1. Furthermore, the local voltage Vlocal is applied to the word lines WL3 and WL7 at time T1. The voltage Vcc may be applied to the string selection line SSL, and a ground voltage Vss may be applied to the ground selection line GSL. The voltage Vcc is applied to the string selection line SSL at T1 or before, but is not limited thereto. The voltage Vcc may be applied to the bit line BL corresponding to the string 211. The voltage Vcc is applied to the bit line BL at T1 or before, but is not limited thereto.

At time T2, the voltage of the word lines WL1, WL2, WL4 to WL6, and WL8 to WLn reaches the target level of the pass voltage Vpass. The voltage of the word lines WL3 and WL7 may reach the target level of the local voltage Vlocal at time T2 or before. Due to the pass voltage Vpass applied to the word lines WL1, WL2, WL4 to WL6, and WL8 to WLn, the channel may be formed in the string 211. The channel formed in the string 211 may be separated by the local voltage Vlocal applied to the word lines WL3 and WL7. The channel including the memory cell MC5 connected to the selected word line WL5 may be formed by the memory cells MC4 to MC6.

The local voltage Vlocal is applied to the word lines WL2 and WL8 at time T2. At time T3, the voltage of the word lines WL2 and WL8 reaches the target level of the local voltage Vlocal, and the pass voltage Vpass is applied to the word lines WL3 and WL7. At time T4, the voltage of the word lines WL3 and WL7 reaches the target level of the pass voltage Vpass, and the program voltage Vpgm is applied to the selected word line WL5.

That is, the channel including the memory cell MC5 connected to the selected word line WL5 is changed from a channel formed by the memory cells MC4 to MC6 into a channel formed by the memory cells MC2 to MC7. Due to changing the word lines (or memory cells) in which the local voltage Vlocal is applied, it can increase the size of the channel including the memory cell MC5 connected to the selected word line WL5. This cause the density of carriers in the channel including the memory cell MC5 connected to the selected word line WL5 to decrease, thereby improving the boosting efficiency of the string 211.

The squeeze operation described with reference to FIGS. 6 through 15 performs the squeeze operation between the selected word line and the first selection transistor (string selection transistor or ground selection transistor). Meanwhile, the squeeze operation described with reference to FIG. 16 performs the squeeze operation between the selected word line and the first and second selection transistors. That is, the density of carriers in the channel according to the program operation described with reference to FIG. 16 may low compared to that of carriers in the channel according to the program operation described with reference to FIGS. 6 through 15.

Figure 17:
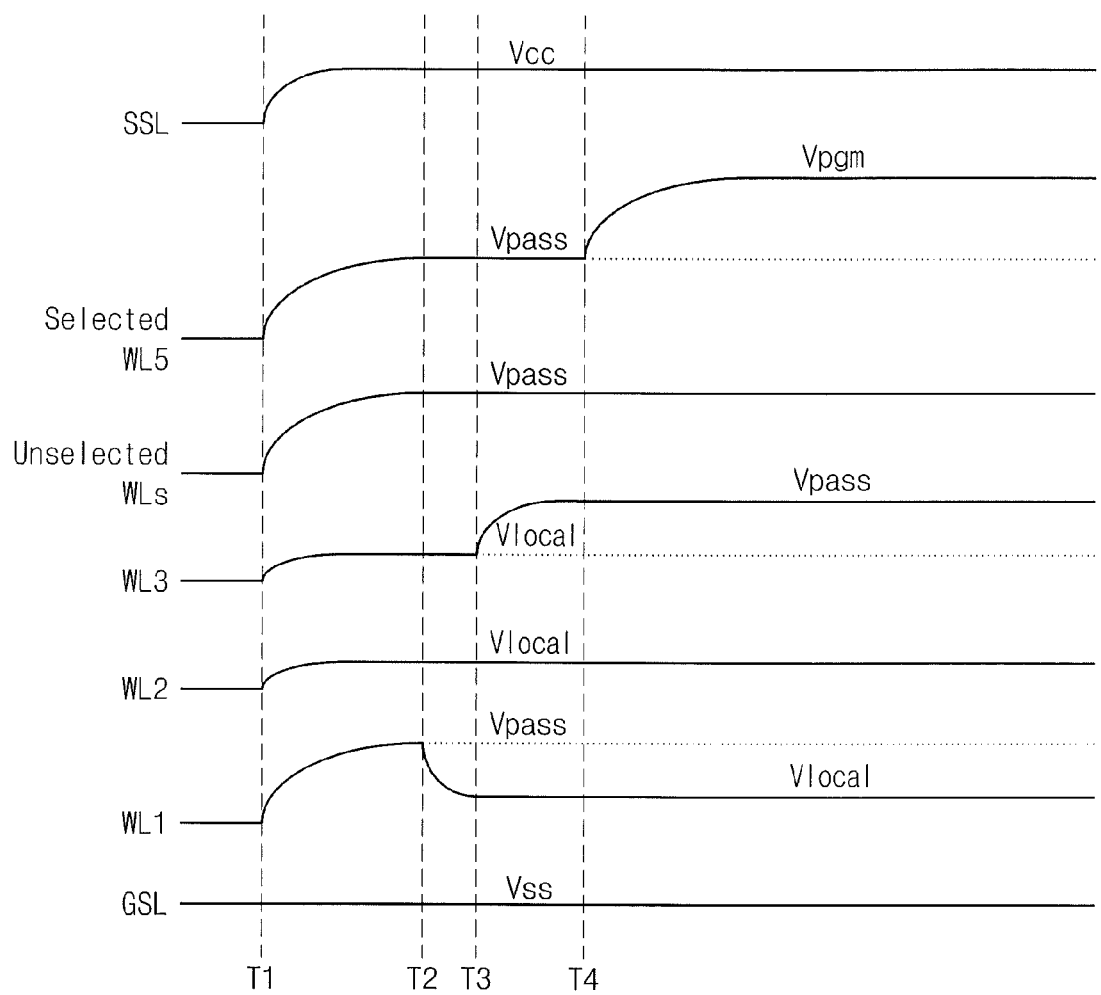
FIG. 17 is a timing illustrating operations with respect to FIG. 5 in accordance with some embodiments.

Referring now to FIG. 17, a timing diagram illustrating some embodiments of the program operation described with reference to FIG. 5 will be discussed. As illustrated in FIG. 17, the unselected word lines may indicate the word lines WL2, WL3, WL5, WL7, and WL8 except for the word lines WL1, WL4, WL6, and WL9 to WLn.

Referring now to FIGS. 3, 4, and 17, the pass voltage Vpass is applied to the selected word line WL5, the word line WL1, and the unselected word lines WL4 and WL6 to WLn at time T1. Furthermore, the local voltage Vlocal is applied to the word lines WL2 and WL3 at time T1. The voltage Vcc may be applied to the string selection line SSL, and a ground voltage Vss may be applied to the ground selection line GSL. The voltage Vcc is applied to the string selection line SSL at T1 or before, but is not limited thereto. The voltage Vcc may be applied to the bit line BL corresponding to the string 211. The voltage Vcc is applied to the bit line BL at T1 or before, but is not limited thereto.

At time T2, the voltage of the word lines WL1 and WL4 to WLn reaches the target level of the pass voltage Vpass. The voltage of the word lines WL2 and WL3 may reach the target level of the local voltage Vlocal at time T2 or before. Due to the pass voltage Vpass applied to the word lines WL1 and WL4 to WLn, the channel may be formed in the string 211. The channel formed in the string 211 may be separated by the local voltage Vlocal applied to the word lines WL2 and WL3. The channel including the memory cell MC5 connected to the selected word line WL5 may be formed by the memory cells MC4 to MCn.

The local voltage Vlocal is applied to the word line WL1 at time T2. At time T3, the voltage of the word line WL1 reaches the target level of the local voltage Vlocal, and the pass voltage Vpass is applied to the word line WL3. At time T4, the voltage of the word line WL3 reaches the target level of the pass voltage Vpass, and the program voltage Vpgm is applied to the selected word line WL5.

That is, the channel including the memory cell MC5 connected to the selected word line WL5 is changed from a channel formed by the memory cells MC4 to MC6 into a channel formed by the memory cells MC3 to MC7. Due to changing the word line (or memory cell) in which the local voltage Vlocal is applied, it can increase the size of the channel including the memory cell MC5 connected to the selected word line WL5. This cause the density of carriers in the channel including the memory cell MC5 connected to the selected word line WL5 to decrease, thereby improving the boosting efficiency of the string 211.

Since the local voltage Vlocal is applied to the word line WL2, it may localize the channel including the selected memory cell MC5. When the local voltage Vlocal is applied to the word line WL2, even though the local voltage Vlocal and the pass voltage Vpass are applied to the word line WL1 and the word line WL3 at the same time, respectively, the channel including the selected memory cell MC5 may be localized. That is, it is possible to improve the program speed.

According to some embodiments described with reference to FIG. 17, the squeeze operation may be performed in the string selection line SSL or the ground selection line GSL, as described with reference to FIGS. 6 and 11.

According to some embodiments illustrated in FIG. 17, the local voltage Vlocal may be applied to the word line between the selected memory cell MC5 and the first selection line (SSL or GSL) to perform the squeeze operation in the second selection line (SSL or GSL), as described with reference to FIGS. 12 and 15.

According to some embodiments illustrated in FIG. 17, the squeeze operation may be performed in the selection lines (SSL and GSL), as described with reference to FIG. 16.

Figure 18:
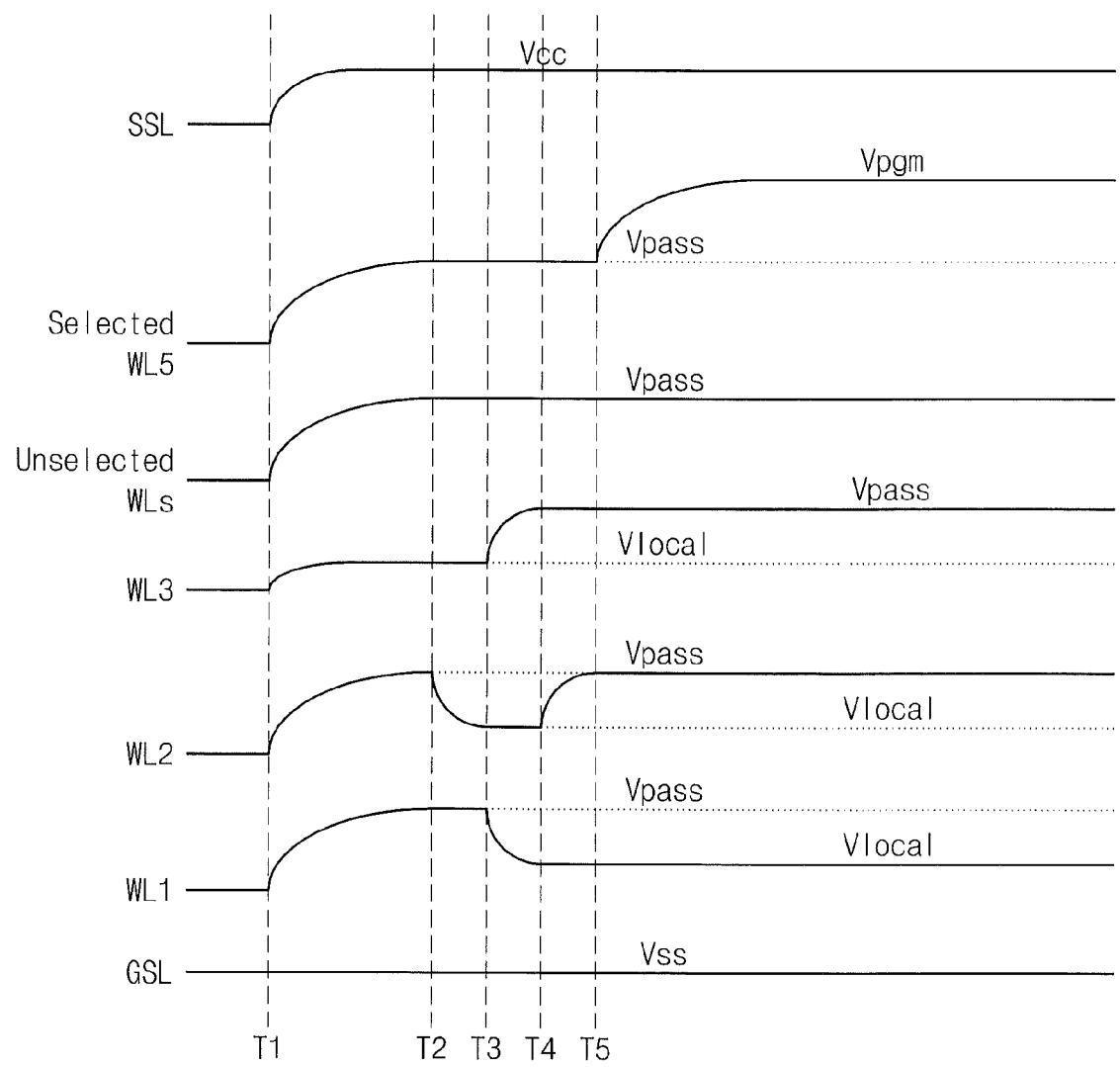
FIG. 18 is a timing diagram illustrating operations with respect to FIG. 5 in accordance with some embodiments.

Referring now to FIG. 18, a timing diagram illustrating some embodiments of the program operation described with reference to FIG. 5 will be discussed. As illustrated in FIG. 18, the unselected word lines may indicate the word lines WL4 and WL3 to WLn except for the word lines WL1 to WL3 and WL5.

Referring now to FIGS. 3, 4, and 18, the pass voltage Vpass is applied to the selected word line WL5, the word lines WL1 and WL2, and the unselected word lines WL4 and WL6 to WLn at time T1. Furthermore, the local voltage Vlocal is applied to the word line WL3 at time T1. The voltage Vcc may be applied to the string selection line SSL, and a ground voltage Vss may be applied to the ground selection line GSL. The voltage Vcc is applied to the string selection line SSL at T1 or before, but is not limited thereto. The voltage Vcc may be applied to the bit line BL corresponding to the string 211. The voltage Vcc is applied to the bit line BL at T1 or before, but is not limited thereto.

At time T2, the voltage of the word lines WL1 and WL4 to WLn reaches the target level of the pass voltage Vpass. The voltage of the word line WL3 may reach the target level of the local voltage Vlocal at time T2 or before. Due to the pass voltage Vpass applied to the word lines WL1 and WL4 to WLn, the channel may be formed in the string 211. The channel formed in the string 211 may be separated by the local voltage Vlocal applied to the word line WL3. The channel including the memory cell MC5 connected to the selected word line WL5 may be formed by the memory cells MC4 to MCn.

The local voltage Vlocal is applied to the word line WL2 at time T2. At time T3, the voltage of the word line WL2 reaches the target level of the local voltage Vlocal, and the pass voltage Vpass is applied to the word line WL3. That is, the word line to which the local voltage Vlocal is applied is squeezed into the word line WL2 from the word line WL3. The local voltage Vlocal is applied to the word line WL1 at time T1.

At time T4, the voltage of the word line WL3 reaches the target level of the pass voltage Vpass, and the voltage of the word line WL1 reaches the target level of the local voltage Vlocal. The pass voltage Vpass is applied to the word line WL2 at time T4. That is, the word line to which the local voltage Vlocal is applied is squeezed into the word line WL1 from the word line WL2.

At time T5, the voltage of the word line WL2 reaches the target level of the pass voltage Vpass, and the program voltage Vpgm is applied to the selected word line WL5.

That is, the channel including the memory cell MC5 connected to the selected word line WL5 is changed from a channel formed by the memory cells MC3 to MCn into a channel formed by the memory cells MC4 to MCn and changed from a channel formed by the memory cells MC2 to MCn into a channel formed by the memory cells MC3 to MCn. Since the squeeze operation is performed twice, the density of carriers in the channel including the memory cell MC5 connected to the selected word line WL5 is low compared to that of carriers when the squeeze operation is performed once. That is, the boosting efficiency of the string 211 may be improved.

According to some embodiments illustrated in FIG. 18, the squeeze operation may be performed in the string selection line SSL or the ground selection line GSL, as described with reference to FIGS. 6 and 11.

According to some embodiments illustrated in FIG. 18, the local voltage Vlocal may be applied to the word line between the selected memory cell MC5 and the first selection line (SSL or GSL) to perform the squeeze operation in the second selection line (SSL or GSL), as described with reference to FIGS. 12 and 15.

According to some embodiments illustrated in FIG. 18, the squeeze operation may be performed in the selection lines (SSL and GSL), as described with reference to FIG. 16.

According to some embodiments illustrated in FIG. 18, during the squeeze operation, the local voltage Vlocal may be applied to the word line WL2 between the word line WL3 where the applied voltage is changed from the pass voltage Vpass into the local voltage Vlocal and the word line WL1 where the applied voltage is changed from the local voltage Vlocal into the pass voltage Vpass, as described with reference to FIG. 17.

Figure 19:
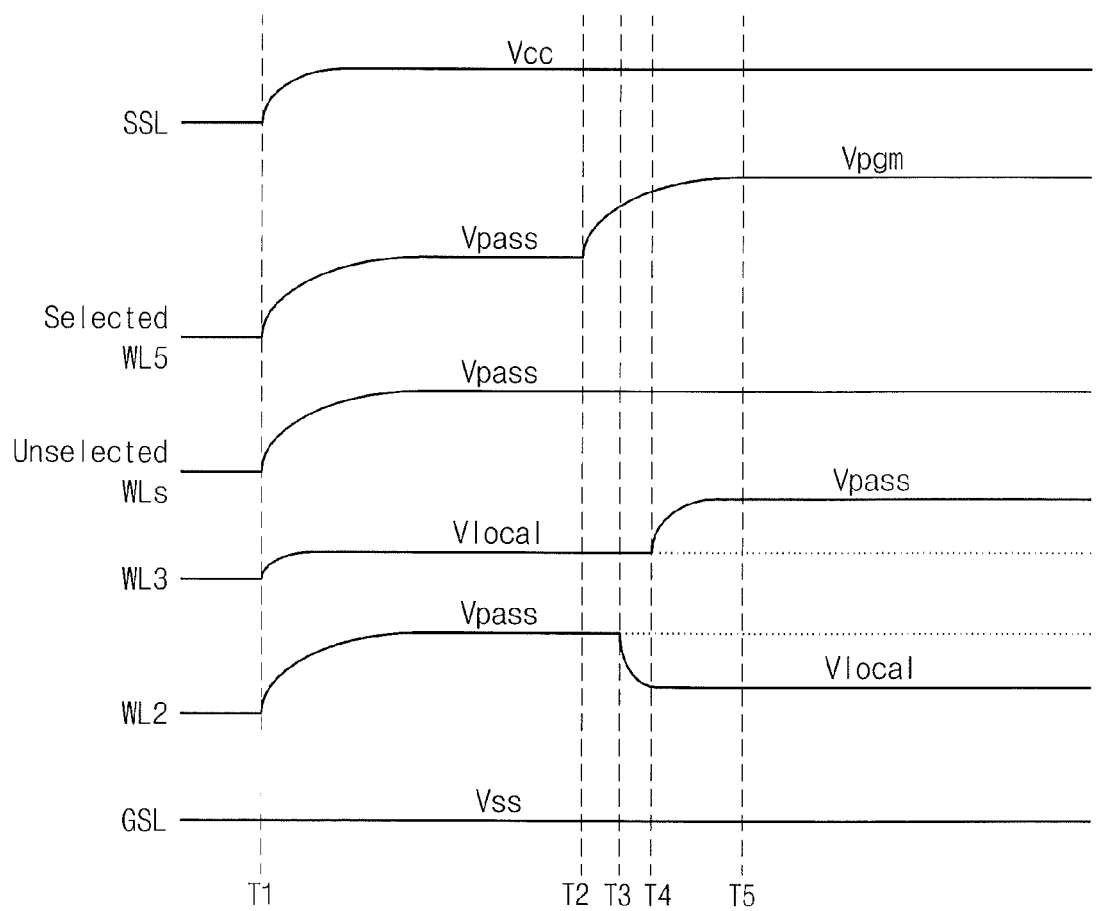
FIG. 19 is a timing diagram illustrating operations with respect to FIG. 5 in accordance with some embodiments.

Referring now to FIG. 19, a timing diagram illustrating some embodiments of the program operation described with reference to FIG. 5 will be discussed. As illustrated in FIG. 19, the unselected word lines may indicate the word lines WL1, WL4, and WL6 to WLn except for the word lines WL2, WL3, and WL5. FIGS. 20 through 23 are diagrams illustrating the formation of channels in the string according to the timing diagram of FIG. 19.

Referring now to FIGS. 3, 4, and 19, the pass voltage Vpass is applied to the selected word line WL5, the word lines WL2 and WL3, and the unselected word lines WL1, WL4, and WL6 to WLn at time T1. Furthermore, the local voltage Vlocal is applied to the word line WL3 at time T1. The voltage Vcc may be applied to the string selection line SSL, and a ground voltage Vss may be applied to the ground selection line GSL. The voltage Vcc is applied to the string selection line SSL at T1 or before, but is not limited thereto. The voltage Vcc may be applied to the bit line BL corresponding to the string 211. The voltage Vcc is applied to the bit line BL at T1 or before, but is not limited thereto.

At time T2, the voltage of the word lines WL1, WL2, and WL4 to WLn reaches the target level of the pass voltage Vpass. The voltage of the word line WL3 may reach the target level of the local voltage Vlocal at time T2 or before. Due to the pass voltage Vpass applied to the word lines WL1, WL2, and WL4 to WLn, the channel may be formed in the string 211. The channel formed in the string 211 may be separated by the local voltage Vlocal applied to the word line WL3. The channel including the memory cell MC5 connected to the selected word line WL5 may be formed by the memory cells MC4 to MCn.

Figure 20:
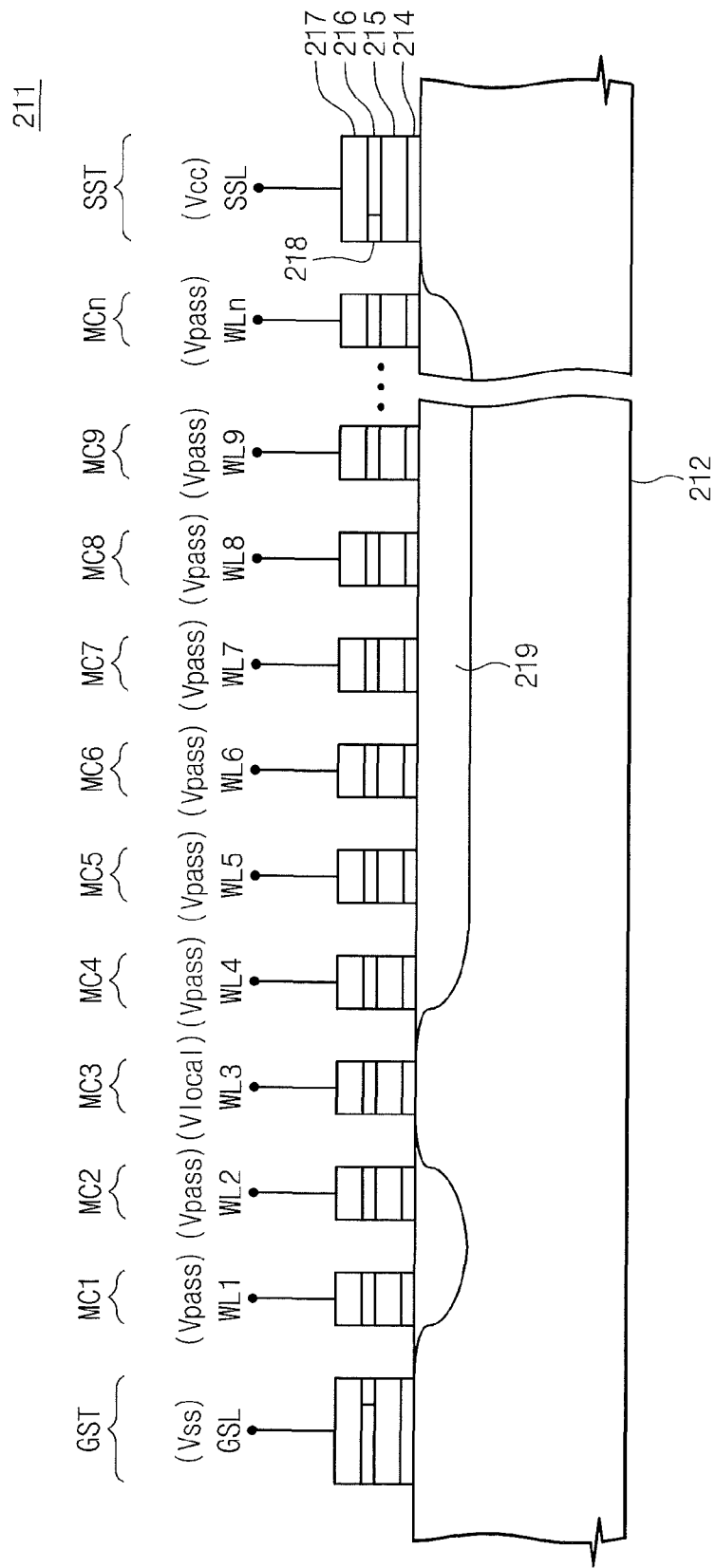
FIGS. 20 through 23 are cross sections illustrating the formation of channels in the string according to the timing diagram of FIG. 19.

At time T2, the channel of the string 211 may be formed as illustrated in FIG. 20. As illustrate in FIG. 20, the channel 219 including the memory cell MC5 connected to the selected word line WL5 may be formed by the memory cells MC4 to MCn.

The program voltage Vpgm is applied to the selected word line WL5 at time T2. At time T3, the voltage of the selected word line WL5 reaches a first level lower than the target level of the program voltage Vpgm. When the voltage of the selected word line WL5 reaches the first level, the local voltage Vlocal is applied to the word line WL2. The voltage of the word line WL2 reaches the target level of the local voltage Vlocal at time T4.

Figure 21:
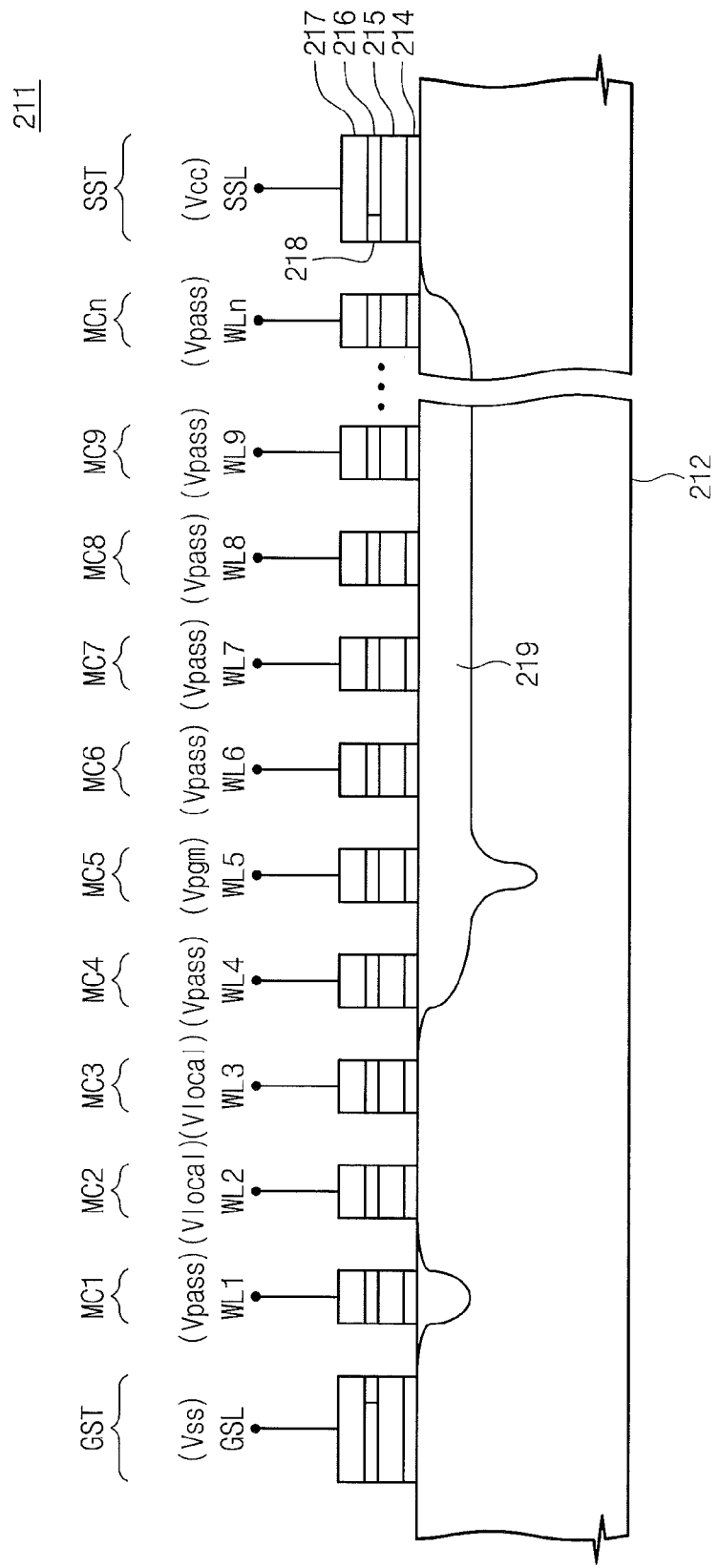

At time T4, the channel of the string 211 may be formed as illustrated in FIG. 21. As illustrate in FIG. 21, the channel 219 including the memory cell MC5 connected to the selected word line WL5 may be formed by the memory cells MC4 to MCn, and the local voltage Vlocal is applied to the word lines WL2 and WL3.

Figure 22:
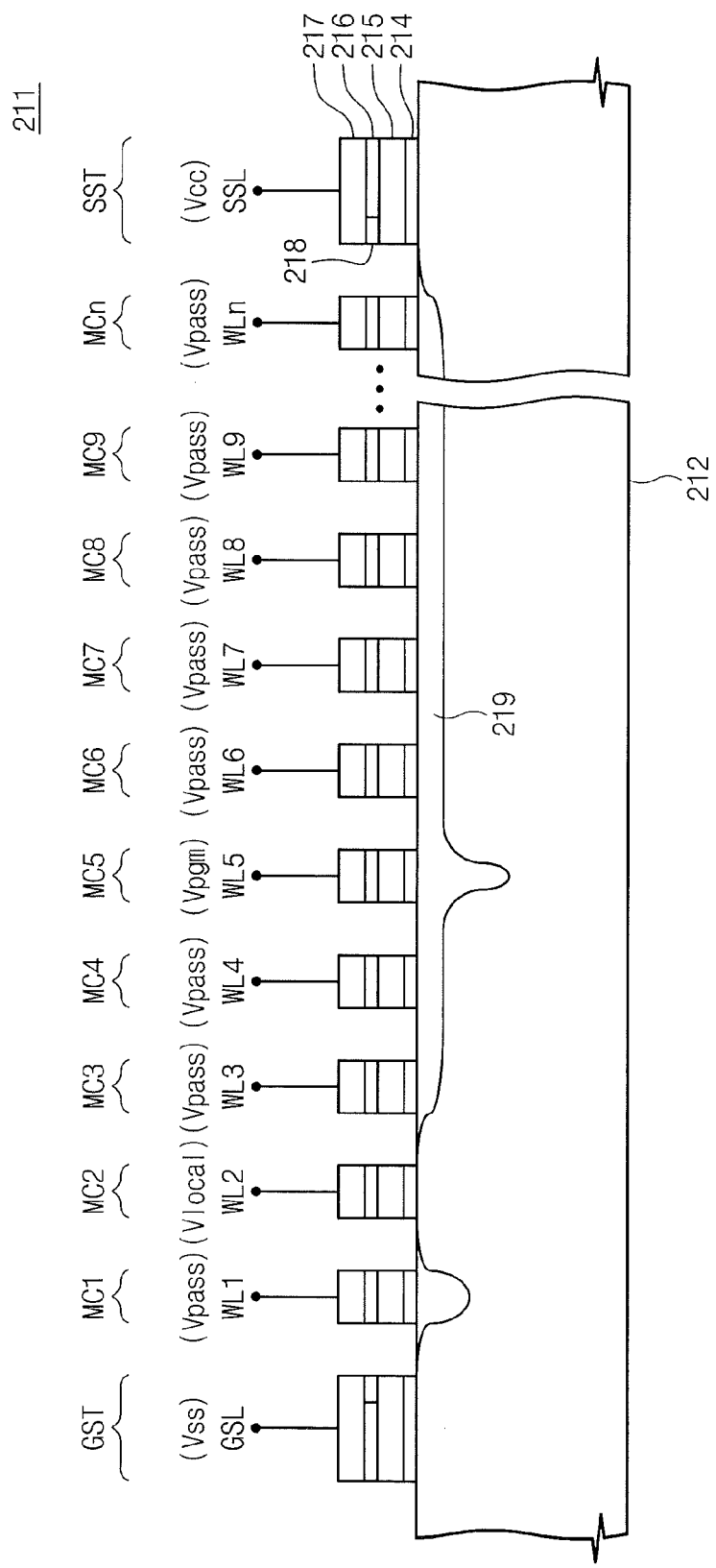

The pass voltage Vpass is applied to the word line WL3 at time T4. When the voltage of the word line WL3 reaches the target level of the pass voltage Vpass, the channel of the string 211 may be formed as illustrated in FIG. 22. As illustrate in FIG. 22, the channel 219 including the memory cell MC5 connected to the selected word line WL5 may be formed by the memory cells MC3 to MCn.

Figure 23:
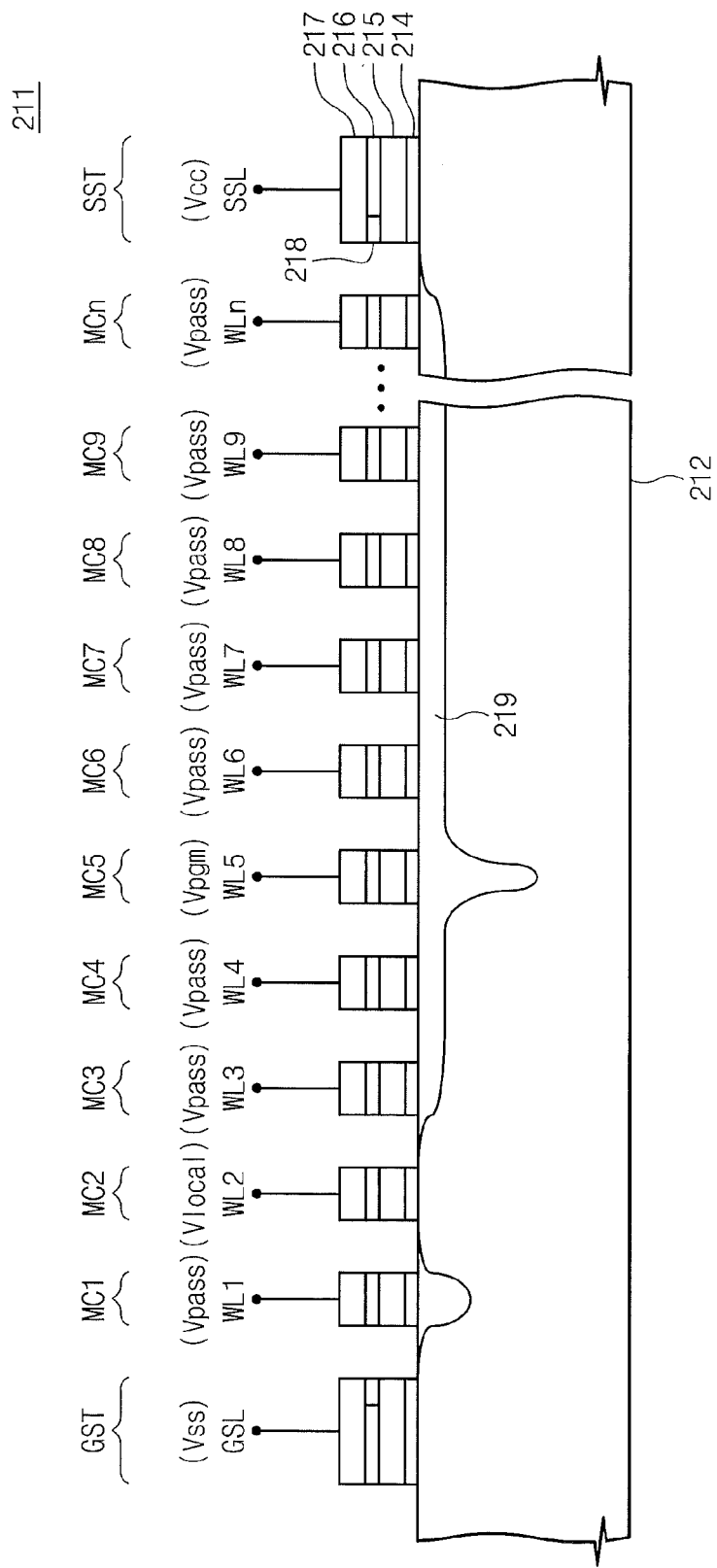

At time T5, the voltage of the selected word line WL5 reaches the target level of the program voltage Vpgm. At this time, the channel of the string 211 may be formed as illustrated in FIG. 23. As illustrated in FIG. 23, the channel 219 including the memory cell MC5 connected to the selected word line WL5 may be formed by the memory cells MC3 to MCn.

While the voltage of the selected word line WL5 ascends up to the target level of the program voltage Vpgm, the channel including the memory cell MC5 connected to the selected word line WL5 is changed from a channel formed by the memory cells MC3 to MCn into a channel formed by the memory cells MC4 to MCn. Therefore, the density of carriers in the channel 219 including the memory cell MC5 connected to the selected word line WL5 becomes lower, thereby improving the boosting efficiency.

As described above, according to some embodiments, the program voltage Vpgm is applied to the selected word line WL5, and the squeeze operation may be performed while the voltage of the selected word line WL5 ascends up to the target level of the program voltage Vpgm.

According to some embodiments illustrated in FIG. 19, the squeeze operation may be performed in the string selection line SSL or the ground selection line GSL, as described with reference to FIGS. 6 and 11.

According to some embodiments illustrated in FIG. 19, the local voltage Vlocal may be applied to the word line between the selected memory cell MC5 and the first selection line (SSL or GSL) to perform the squeeze operation in the second selection line (SSL or GSL), as described with reference to FIGS. 12 and 15.

According to some embodiments illustrated in FIG. 19, the squeeze operation may be performed in the selection lines (SSL and GSL), as described with reference to FIG. 16.

According to some embodiments illustrated in FIG. 19, during the squeeze operation, the local voltage Vlocal may be applied to the word line WL2 between the word line WL3 where the applied voltage is changed from the pass voltage Vpass into the local voltage Vlocal and the word line WL1 where the applied voltage is changed from the local voltage Vlocal into the pass voltage Vpass, as described with reference to FIG. 17.

Figure 24:
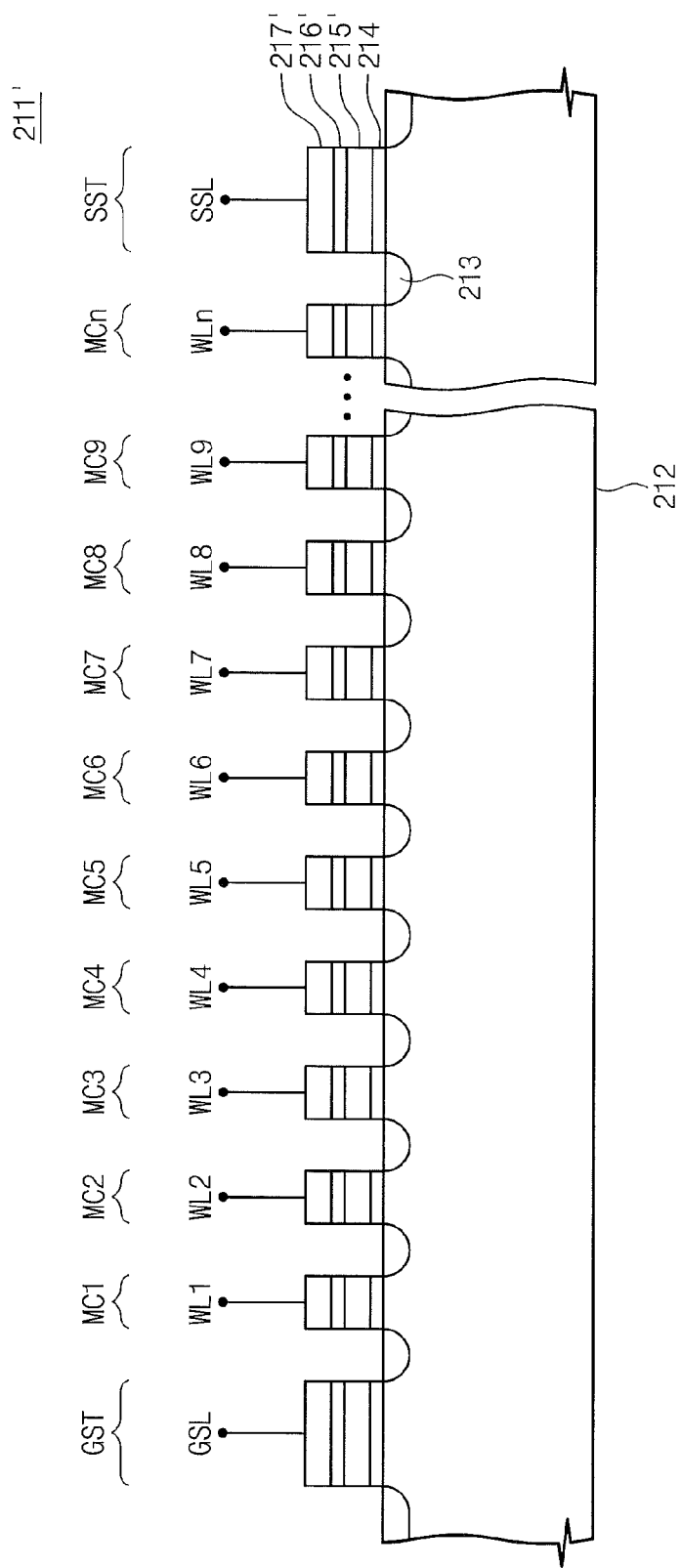
FIG. 24 is a cross section illustrating one string in the memory cell array of FIG. 3 in accordance with some embodiments.

FIG. 24 is a cross section illustrating some embodiments of string 211' of one string 211 in the memory cell array of FIG. 3. As illustrated in FIG. 24, drain/source regions 213 are provided on the bulk region 212. Gate structures are provided on the bulk region 212 and between the drain/source regions 213. Each of the gate structures may include a tunnel insulation layer 214, a charge storage layer 215', a blocking insulation layer 216', and a control gate 217'.

The string 211' of FIG. 24 may be configured in a same manner as the string 211 described with reference to FIG. 4 except for the charge storage layer 215', the blocking insulation layer 216', and the control gate 217'.

The charge storage layer 215' may be configured so as to accumulate or trap charges. The charge storage layer 215' may be formed of a conductor such as poly silicon. Alternatively, the charge storage layer 215' may be formed of an insulator such as a silicon oxide or a silicon nitride.

The blocking insulation layer 216' provides an insulation property between the charge storage layer 215' and the control gate 217'. The blocking insulation layer 216' may be formed of an insulator such as a silicon oxide or a silicon nitride.

The control gate 217' may be connected to the corresponding word line. The control gate 217' may be formed of a conductor such as poly silicon. The control gate 217' extends in a direction intersecting the bit lines BLs to form the word lines WLs and the selection transistors SST and GST.

The charge storage layer 215' and the control gate 217' of the selection transistors SST and GST may electrically be isolated from each other by the blocking insulation layer 216'. In other to maintain a threshold voltage of the selection transistors SST and GST at a target value, the selection transistors SST and GST may be programmed by the F-N tunneling or hot electron injection.

Some embodiments discussed herein with reference to FIGS. 6 through 23 may be performed in the string 211' illustrated in FIG. 24. The squeeze operation according to some embodiments may be performed in the string 211' illustrated in FIG. 24.

According to some embodiments, at a certain time, the voltage of the first word line reaches the target level of the first voltage, and at the same time, the second voltage is applied to the second word line. For instance, the voltage of the word line (ex., WL5) reaches the target level of the pass voltage Vpass, and the same time, the local voltage Vlocal is applied to the word line (ex., WL2). Moreover, the voltage of the word line WL2 reaches the target level of the local voltage Vlocal, and the same time, the pass voltage Vpass is applied to the word line WL3. The above-described operations are simultaneously performed at a certain time, but are not limited thereto, After the voltage of the channel including the memory cell (ex., MC5) connected to the selected word line (ex., WL5) is boosted up to a predetermined level by the pass voltage Vpass, the local voltage Vlocal may be applied to the word line (ex., WL2). For instance, when or after the voltage of the selected word line (ex., WL5) reaches the target level of the pass voltage Vpass, the local voltage Vlocal may be applied to the word line (ex., WL2).

After the channel including the memory cell (ex., MC5) connected to the selected word line (ex., WL5) is separated up to a predetermined level by the local voltage Vlocal applied to the word line (ex., WL2), the pass voltage Vpass may be applied to the word line (ex., WL3). For instance, after the voltage of the word line (ex., WL2) reaches the target level of the local voltage Vlocal, the pass voltage Vpass may be applied to the word line (ex., WL3). That is, the squeeze operation according to some embodiments maintains the voltage of at least one word line at the target level of the local voltage Vlocal, thereby localizing the channel.

In some embodiments, at least one word line exists between the word lines and the selected word lines to which the local voltage Vlocal is applied. However, the position of the word lines and the selected word lines to which the local voltage Vlocal is applied may be changeable and applicable.

Figure 25:
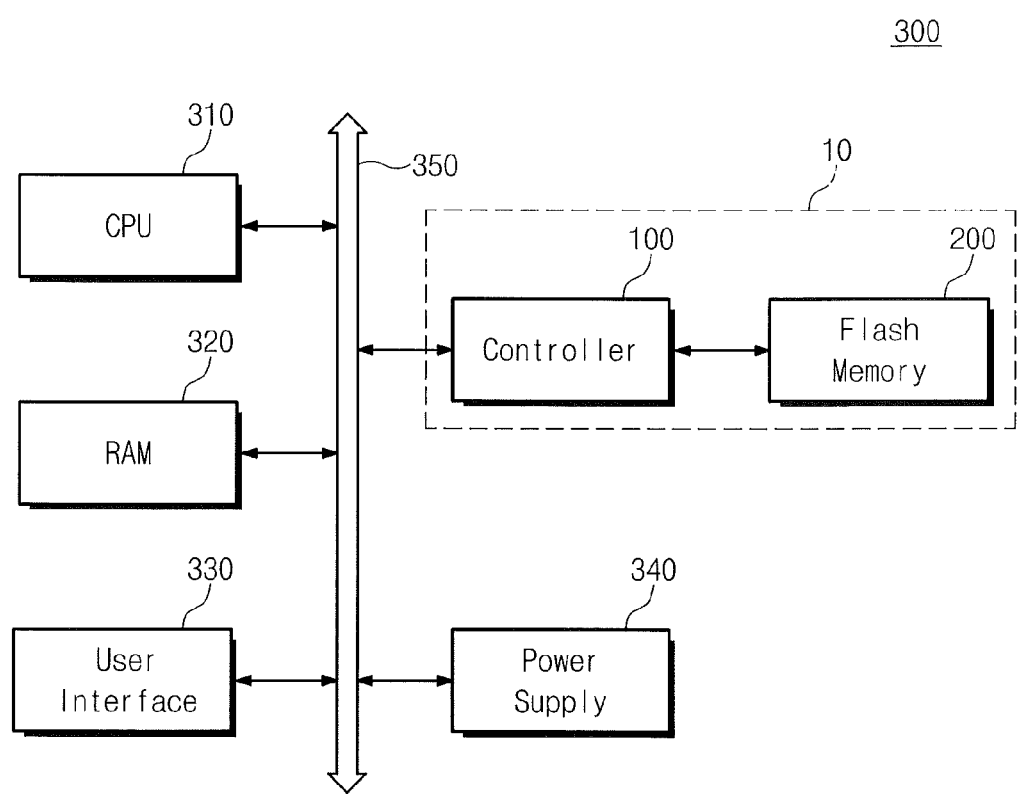
FIG. 25 is a block diagram illustrating a system including a memory system in accordance with some embodiments.

Referring now to FIG. 25, a block diagram illustrating a computing system 300 including a memory system 10 will be discussed. Referring now to FIG. 25, the computing system 300 includes a central processing unit (CPU) 310, a RAM 320, a user interface 330, a power supply 340, and a memory system 10.

The memory system 10 is connected to the CPU 310, RAM 320, user interface 330, and power supply 340 through a bus 350. Data is provided through the user interface 330 or processed by the CPU 310. The data is stored in the memory system 10. The memory system 10 includes a controller 100 and a flash memory 200.

When the memory system 10 is mounted as a solid state disk (SSD), a booting speed of the computing system 300 dramatically accelerates. Although not illustrated in FIG. 25, it will be apparent to those skilled in the art that for example, an application chipset and a Camera Image Processor (CIS) may further be provided in the system according to some embodiments discussed herein.

In the flash memory device according to some embodiments discussed herein, the local voltage is applied to the first word line, the local voltage is applied to the second word line, and the pass voltage is applied to the first word line. Accordingly, the flash memory device according to some embodiments improves the boosting efficiency of the program-inhibited cell, thereby reducing or possibly preventing the program disturbance.

Although the inventive concept has been described in connection with the embodiment of the inventive concept illustrated in the accompanying drawings, it is not limited thereto. It will be apparent to those skilled in the art that various substitution, modifications and changes may be thereto without departing from the scope and spirit of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A programming method of a nonvolatile memory device, comprising:
   applying a turn-on voltage to a string selection line and a ground voltage to a ground selection line;
   applying a first local voltage to a first unselected word line;
   applying a second local voltage to a second unselected word line, after the first local voltage is applied to the first unselected word line; applying a pass voltage to the first unselected word line, after the second local voltage is applied to the second unselected word line; and
   applying a program voltage to a selected word line,
   wherein the first and second local voltages have the same level.

2. The method of claim 1, wherein the first unselected word line is between the selected word line and one of the string and ground selection lines, and the second unselected word line is between the first unselected word line and the one of the string and ground selection lines.

3. The method of claim 1, further comprising applying the pass voltage to the selected word line when the first local voltage is applied to the first unselected word line.

4. The method of claim 3, wherein the second local voltage is applied to the second unselected word line after the voltage of the selected word line reaches a target level of the pass voltage.

5. The method of claim 1, wherein the pass voltage is applied to the first unselected word line after the voltage of the second unselected word line reaches a target level of the second local voltage.

6. The method of claim 5, wherein the program voltage is applied to the selected word line after a voltage of the first unselected word line reaches a target level of the pass voltage.

7. The method of claim 1, wherein the program voltage is applied to the selected word line before the second local voltage is applied to the second unselected word line,
wherein the second local voltage is applied to the second unselected word line before a voltage of the selected word line reaches a target level of the program voltage.

8. The method of claim 7, further comprising controlling a voltage of the first unselected word line so as to reach the target level of the pass voltage before the voltage of the selected word line reaches a target level of the program voltage.

9. The method of claim 1, further comprising:
applying a third local voltage to a third unselected word line after the pass voltage is applied to the first unselected word line; and
applying the pass voltage to the second unselected word line after the third local voltage is applied to the third unselected word line.

10. The method of claim 9, wherein the first to third unselected word lines are sequentially disposed in a direction from the selected word line toward one of the string and ground selection lines.

11. The method of claim 1, further comprising applying a third local voltage to a third unselected word line located between the first and second unselected word lines when the first local voltage is applied to the first unselected word line, wherein the first and second unselected word lines are located between the selected word line and one of the string and ground selection lines.

12. The method of claim 1, further comprising applying a third local voltage to a third unselected word line located between the selected word line and a first selection line of the string and ground selection lines when the first local voltage is applied to the first unselected word line,
wherein the first and second unselected word lines are between the selected word line and a second selection line of the string and ground selection lines.

13. A nonvolatile memory device, comprising:
a memory cell string including first and second memory cells and a selected memory cell between a string selection transistor and a ground selection transistor and
a program controller for controlling a program operation of the selected memory cell,
wherein the program controller is configured to apply a turn-on voltage to the string selection transistor, apply a ground voltage to the ground selection transistor, apply a first local voltage to the first memory cell, apply a second local voltage to the second memory cell after the first local voltage is applied to the first memory cell and apply a program voltage to the selected memory cell during the program operation of the selected memory cell,
wherein the first and second local voltages have the same level.

14. The nonvolatile memory device of claim 13, wherein the program controller is further configured to apply a pass voltage to the selected memory cell when the first local voltage is applied to the first memory cell.

15. The nonvolatile memory device of claim 13, wherein the program controller is further configured to apply a pass voltage to the first memory cell after the second local voltage is applied to the second memory cell.

16. The nonvolatile memory device of claim 15, wherein the program controller is further configured to apply the program voltage to the selected memory cell after the pass voltage is applied to the first memory cell.

17. The nonvolatile memory device of claim 13, wherein the program controller is further configured to apply the program voltage to the selected memory cell before the second local voltage is applied to the second memory cell.

18. A memory system, comprising:
a nonvolatile memory device; and
a controller configured to control the nonvolatile memory device, wherein the nonvolatile memory device comprises:
a memory cell array including first and second memory cells and a selected memory cell between a string selection transistor and a ground selection transistor; and
a program controller configured to control a program operation of the selected memory cell;
wherein the program controller is configured to apply a turn-on voltage to the string selection transistor, apply a ground voltage to the ground selection transistor, apply a first local voltage to the first memory cell, apply a second local voltage to the second memory cell after the first local voltage is applied to the first memory cell and apply a program voltage to the selected memory cell during the program operation of the selected memory cell,
wherein the first and second local voltages have the same level.

19. The memory system of claim 18, wherein the nonvolatile memory device and the controller form a solid-state drive (SSD).

20. The memory system of claim 18, wherein the nonvolatile memory device and the controller form a memory card.

* * * * *